(12) United States Patent
Nobukata

(10) Patent No.: US 6,259,624 B1
(45) Date of Patent: Jul. 10, 2001

(54) NONVOLATILE SEMICONDUCTOR STORAGE DEVICE AND DATA WRITING METHOD THEREOF

(75) Inventor: Hiromi Nobukata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/435,632

(22) Filed: Nov. 8, 1999

(30) Foreign Application Priority Data

Nov. 10, 1998 (JP) .................................................. 10-319622

(51) Int. Cl.$^7$ .................................................. G11C 16/04
(52) U.S. Cl. ................................ 365/185.03; 365/185.02; 365/185.12
(58) Field of Search ......................... 365/185.03, 185.02, 365/185.12, 185.18, 185.22, 185.24

(56) References Cited

U.S. PATENT DOCUMENTS 5,995,412 * 11/1999 Ohta .................................. 365/185.03
6,055,181 * 11/1999 Tanaka et al. ................... 365/185.03
6,058,042 * 5/2000 Nobukata ........................ 365/185.03

* cited by examiner

Primary Examiner—David Nelms
Assistant Examiner—David Lam
(74) Attorney, Agent, or Firm—Ronald P. Kananen; Rader, Fishman & Grauer

(57) ABSTRACT

A nonvolatile semiconductor storage device is disclosed. The device has memory cells for storing data corresponding to threshold voltages that vary corresponding to the amount of electric charge stored in electric charge storing portions, the amount of electric charge varying corresponding to voltages supplied to word lines and bit lines, multi-value data of n bits (where n≧2) being written in parallel and page by page to the memory cells. The device comprises a write controlling means for supplying a voltage for word lines as a pulse signal to memory cells and controlling the pulse width of the effective voltage of word lines corresponding to a substantial write time period of data written to the memory cells.

12 Claims, 9 Drawing Sheets

NONVOLATILE SEMICONDUCTOR STORAGE DEVICE AND DATA WRITING METHOD THEREOF

BACKGROUND OF THE INVENTION

1. Field of the Invention

The present invention relates to a nonvolatile semiconductor storage device and a data writing method thereof. In particular, the present invention relates to a multi-value type nonvolatile semiconductor storage device of which each memory cell stores multi-value data of two bits or more and a data writing method thereof.

2. Description of the Related Art

In recent years, flash memories are becoming common as record mediums for use with video/audio units and portable information units because of their higher electric characteristics than those of conventional various record units and hard disk units. A flash memory is a rewritable nonvolatile semiconductor storage device. With respect to connection and structure of flash memories, they can be roughly categorized as NOR type and NAND type. Conventional nonvolatile semiconductor storage devices such as memories are normally two-value type devices of which each memory cell stores data of two values "0" and "1". However, recently, as large storage capacities of semiconductor storage devices are being required, a so-called multi-value type nonvolatile semiconductor storage device of which each memory cell stores multi-value data of three values or more (two bits or more) has been proposed.

As examples of such multi-value type nonvolatile semiconductor storage devices, a four-value type NAND flash memory and an eight-value type NAND flash memory are known. In the four-value type NAND flash memory, each memory cell transistor stores data of two bits that represents four values. In the eight-value type NAND flash memory, each memory cell transistor stores data of three bits that represents eight values.

FIG. 1 is a graph showing the relation between distributions of threshold voltages Vth and data of memory cell transistors of an eight-value type NAND flash memory. In FIG. 1, the vertical axis represents threshold voltages Vth of memory cell transistors, whereas the horizontal axis represents distributions of the threshold voltages Vth of the memory cell transistors.

As shown in FIG. 1, in the eight-value type NAND flash memory, the threshold voltages Vth of the memory cell transistors are in eight states (distribution 7 to distribution 0) corresponding to data "000", "001 ", "010", "011", "100", "101", "110", and "111", respectively. In FIG. 1, VVF1, VVF2, VVF3, VVF4, VVF5, VVF6, and VVF7 represent voltages of selected word lines in verifying operations corresponding to these states. On the other hand, VRD1, VRD2, VRD3, VRD4, VRD5, VRD6, and VRD7 represent voltages of selected word lines in normal reading operations corresponding to these states. The voltages of the selected word lines have the relation of VVF7>VRD7>VVF6>VRD6>VVF5>VRD5>VVF4>VRD4>VVF3>VRD3>VVF2>VRD2>VVF1>VRD1. For example, VVF7=3.8 V, VRD7=3.6 V, VVF6=3.2 V, VRD6=3.0 V, VVF5=2.6 V, VRD5=2.4 V, VVF4=2.0 V, VRD4=1.8 V, VVF3=1.4 V, VRD3=1.2 V, VVF2=0.8 V, VRD2=0.6 V, VVF1=0.2 V, VRD1=0 V.

However, in multi-value type NAND flash memories, as a method for writing data to memory cells, multi-value data is written at a time (in parallel) in such a manner that the voltage of bit lines is varied corresponding to write data. This method is referred to as multi-value parallel writing method and used to speed up the writing operations. In the case of an eight-value type NAND flash memory, ideally, as shown in column (a) of FIG. 1, when the voltage of the bit line for write data "000" is set to 0 V, the voltage of the bit line for write data "001" is set to 0.6 V, the voltage of the bit line for write data "010" is set to 1.2 V, the voltage of the bit line for write data "011" is set to 1.8 V, the voltage of the bit line for write data "100" is set to 2.4 V, the voltage of the bit line for write data "101" is set to 3.0 V, the voltage of the bit line for write data "110" is set to 3.6 V, the voltage of the bit line for write data "111" is set to 8.0 V, then all data in different write levels can be written almost at the same time.

However, from view points of low power consumption and low device area, a so-called self-boost method or local self-boost is used.

Next, with reference to FIG. 2, a self-boost writing method will be described. A memory cell of an NAND flash memory is composed of a MOS transistor having a floating gate (FG) and a control gate (CG). A predetermined number of the same memory cell transistors are connected in series as a memory string. In a memory array of the NAND flash memory, a plurality of memory strings are disposed in parallel. In the memory array, memory cell transistors on the same line are connected with a common word line. In the example shown in FIG. 2, one memory string is composed of eight memory transistors $M_0$ to $M_7$ connected in series. One end of the memory string (namely, the drain of a memory cell transistor $M_7$) is connected to a bit line BL through a selected transistor DS. The other end of the memory string (the source of a memory transistor $M_0$) is connected to a source line SL through a selected transistor SS. The control gates of the memory cell transistors $M_0$ to $M_7$ are connected to the word lines WL0 to WL7, respectively. The gate of the selected transistor DS is connected to a drain side selected transistor SS. The gate of the selected transistor SS is connected to a source side selected gate line SSG.

In the self-boost writing method, the signal level of the drain side selected gate line DSG is set to Vcc. In addition, the signal level of the source side selected gate line SSG is set to GND. When a memory string is selected corresponding to an address decode signal, the voltage of bit lines connected to the selected memory string is set to VBL corresponding to write data. The voltages of bit lines connected to memory strings that have not been selected are kept in a pre-charge level (i.e., in a floating state). Thereafter, the voltage of the selected word line as a write page (in this example shown in FIG. 2, the word line is WL4) is set to a predetermined write voltage VPGM. The voltage of the other non-selected word lines is set to a write pass voltage Vpass (<VPGM). Thus, data is written to write memory cell transistors.

At this point, channels of memory cell transistors whose write data is the same as erase state (namely, the write data is "111") and channels of non-selected memory cell transistors of the memory string are disconnected from the relevant bit lines BL by the drain side selected transistor DS. The voltages of the memory cell transistors are boosted to a non-write voltage by a coupling connection with word lines, and mainly, non-selected word lines.

However, in the self-boost writing method or local-boost writing method, since the signal level of the drain side selected gate line DSG is set to VCC, the voltage supplied to channels of memory cell transistors of the memory string through the bit lines BL is limited to $V_{cc}$—VthDSG (where VthDSG is a threshold voltage of the selected transistor DS) by the drain side selected transistor DS of the memory string. Thus, when data is written, the upper limit of the voltage supplied to the bit lines BL is $V_{cc}$—VthDSG with a margin (for example, 1.5 V).

In a multi-value type NAND flash memory, from a viewpoint of a write speed, it is preferred that the voltage of bit lines is set corresponding to write data in the relation of 1 to 1. However, in an eight-value type NAND flash memory, eight-value latch circuits should be disposed corresponding to the number of bit lines. Thus, actually, the voltage of bit lines for write data "00x" (where x is 0 or 1) is set to 0 V, the voltage of bit lines for write data "01x" (where x is 0 or 1) is set to VB1, the voltage of bit lines for write data "1x" (where x is 0 or 1) is set to VB2, the voltage of bit lines for write data "110" is set to VB3, and the voltage of bit lines for write data "111" is set to $V_{cc}$ (where VB1, VB2, and VB3 are larger than 0 V and smaller than $V_{cc}$). Thus, one voltage of a bit line is set for a plurality of pieces of data.

Thus, when data is written to an eight-value type NAND flash memory, as shown in column (b) of FIG. 2B, the voltage of bit lines for write data "00x" (where x is 0 or 1) is set to 0 V, the voltage of bit lines for write data "01x" (where x is 0 or 1) is set to 1.2 V, the voltage of bit lines for write data "10x" (where x is 0 or 1) is set to 1.5 V, the voltage of bit lines for write data "110" is set to 1.5 V, and the voltage of bit lines for write data "111" is set to $V_{cc}$. In such a manner, the multi-value parallel writing operation is performed.

Next, with reference to the accompanying drawings, the structure and writing operation of an eight-value type NAND flash memory according to the multi-value parallel writing method will be described.

FIG. 3 shows principal portions of the eight-value type NAND flash memory that the inventor of the present invention has proposed. In FIG. 3, reference numeral 101 is a memory cell array. Reference numeral 102 is a bit line voltage generating circuit.

As shown in FIG. 3, a memory cell array 101 has MOS transistors (memory cell transistors) disposed in a matrix shape. Each of the MOS transistors has for example a floating gate (FG) and a control gate (CG) and functions as a three-bit memory cell. The control gates of memory cell transistors of the same lines are connected to common word lines WL0 to WL15. Memory cell transistors on the same rows are memory strings A0 to An. In FIG. 3, only the memory strings A0 and A1 are shown. The other memory strings A2 to An are omitted.

Thus, each memory string is composed of a plurality of memory cell transistors disposed in series. A memory string A0 is composed of memory cell transistors $M_{0-0}$ to $M_{15-0}$. The drain of the memory cell transistor $M_{15-0}$ is connected to the source of a selected transistor DS0. The drain of the selected transistor DS0 is connected to a bit BL0. The source of the memory cell transistor $MC_{0-0}$ is connected to the drain of a selected transistor SS0. The source of the selected transistor SS0 is connected to a source line SL. The control gates of the memory cell transistors $M_{0-0}$ to $M_{15-0}$ are connected to word lines WL0 to WL15, respectively. Likewise, the memory string A1 is composed of memory cell transistors $M_{0-1}$ to $M_{15-1}$. The drain of the memory cell transistor $M_{15-1}$ is connected to the source of a selected transistor DS1. The drain of the selected transistor DS1 is connected to a bit line BL1. The source of the memory cell transistor $M_{0-1}$ is connected to the drain of a selected transistor SS1. The source of the selected transistor SS1 is connected to the source line SL. The control gates of the memory cell transistors $M_{0-1}$ to $M_{15-1}$ are connected to the word lines WL0 to WL15, respectively.

In such a manner, the memory strings A0 and A1 are connected to various lines. These connection relations apply to the other memory strings A2 to An. Thus, first terminals of the memory strings A0 to An are connected to the bit lines BL0 to BLn through the selected transistors SS0 to SSn, respectively. The other terminals of the memory strings A0 to AN are connected to the source line SL through the selected transistors SS0 to SSn, respectively. The gates of the selected transistors DS0 to DSn are connected to a common drain side selected gate line DSG. The gates of the selected transistors SS0 to SSn are connected to a common source side selected gate line SSG. In the memory array 101, the memory strings A0 to An are disposed in parallel.

A bit line voltage generating circuit 102 is disposed corresponding to the bit lines BL0 and BL1. The bit line voltage generating circuit 102 is composed of transistors N101 to N111, latch circuits LQ2, LQ1, and LQ0, and a transistor P101. Each of the transistors N101 to N111 is composed of an n channel MOS transistor. Each of the latch circuits LQ2, LQ1, and LQ0 is composed of two invertors of which the input of the first inverter is connected to the output of the second inverter and of which the input of the second inverter is connected to the output of the first inverter. The transistor P101 is composed of a p channel MOS transistor. The bit line voltage generating circuit 102 is connected to bit line voltage supplying lines VBL1, VBL2, and VBL3 connected to respective constant voltage sources. In the NAND flash memory, two bit lines are selectively connected to the bit line voltage generating circuit 102 having the latch circuits LQ2 to LQ0. This structure is referred to as a bit line shared structure. This structure applies to other bit line voltage generating circuits corresponding to other bit lines BL2 to BLn. For simplicity, the description of the other bit line voltage generating circuits will be omitted.

The bit line voltage generating circuit 102 generates a bit line voltage corresponding to write data. The generated bit line voltage is supplied to channels of memory cell transistors of the memory cell array 101 through the bit lines BL0 to BL1.

Transistors HN101 and HN103 are connected in series between the bit BL0 and the node SA. Each of the transistors HN101 and HN103 are composed of an n channel MOS transistor with a high withstand voltage. Likewise, transistors HN102 and HN104 are connected in serial between the bit line BL1 and the node SA. Each of the transistors HN102 and HN104 is composed of an n channel MOS transistor with a high withstand voltage. A common control signal TRN is supplied to the gates of the transistors HN101 and HN102. An address decode signal AiB is supplied to the gate of the transistor HN103. An address decode signal AiN is supplied to the gate of the transistor HN104.

In the bit line voltage generating circuit 102, a transistor P101 is connected between the node SA and a power supplying line of the power supply voltage $V_{cc}$ (for example, $V_{cc}$=3.3 V). A control signal Vref is supplied to the gate of the transistor P101. A transistor N101 is connected between the node SA and a ground line. A control signal DIS is supplied to the gate of the transistor N101.

In the bit line voltage generating circuit 102, the drain of the transistor N102 is connected to the node SA. The source of the transistor N102 is connected to the drains of the transistors N103, N105, N107, and N109. A control signal PGM is supplied to the gate of the transistor N102.

The transistors N103 and N104 are connected in series between the source of the transistor N102 and the ground line. The transistors N105 and N106 are connected in series between the source of the transistor N102 and the bit line voltage supplying line VBL1. The transistors N107 and N108 are connected in series between the source of the transistor N102 and the bit line voltage supplying line VBL2. The transistors N109, N101, and N111 are connected in series between the source of the transistor N102 and the bit line voltage supplying line VBL3.

The latch circuits LQ2, LQ1, and LQ0 have storage nodes Q2, Q1, and Q0 and their inverted storage nodes /Q2, /Q1, and /Q0, respectively (where "/" is a bar representing an inversion).

The inverted storage node /Q2 of the latch circuit LQ2 is connected to the gates of the transistors N104 and N106. The storage node Q2 of the latch circuit LQ2 is connected to the gates of the transistors N107 and N109. The inverted storage node /Q1 of the latch circuit LQ1 is connected to the gates of the transistors N103 and N108. The storage node Q1 of the latch circuit LQ1 is connected to the gates of the transistors N105 and N110. The inverted storage node /Q0 of the latch circuit LQ0 is connected to the gate of the transistor N111.

Next, with reference to a timing chart of FIG. 4, the writing operation of the eight-value type NAND flash memory will be described.

Before the writing operation is performed, the signal level of the control signal PGM is set to low (GND). Thus, the transistor N102 is turned off. Consequently, the bit lines BL0 and BL1 are disconnected from the write controlling circuit 102. The signal level of the control signal DIS is set to high ($V_{cc}$). The control signal TRN and the address decode signals AiB and AiN are set to a ($V_{cc}$-Vth) level. At this point, since the transistors HN101, HN102, HN103, and HN104 and the transistor N101 have been turned on, all the bit lines have been grounded. The bit line voltage supplying line VBL1 is set to VB1. The bit line voltage supplying line VBL2 is set to VB2. The bit line voltage supplying line VBL3 is set to VB3. The voltages VB1, VB2, and VB3 are higher than 0 V and lower than $V_{cc}$. For example, the voltages VB1, VB2, and VB3 are 1.2 V, 1.5 V, and 1.5 V, respectively.

In such a state, when the writing operation is performed, write data is supplied to the latch circuits LQ2, LQ1, and LQ0 of the bit line voltage generating circuit 102 through the data bus. The write data is latched by the latch circuit LQ2, LQ1, and LQ1. Thereafter, the signal level of the control signal DIS is set to low. Thus, the bit lines BL0 and BL1 are disconnected from the ground line. The control signal TRN and the address decode signals AiB and AiN are set to a predetermined high level that exceeds $V_{cc}$. For example, the control signal TRN and the address decode signals are set to P5 V (5 to 6 V as a path voltage when data is read). In addition, the signal level of the control signal Vref is set to low (GND). Thus, the voltages of all the bit lines are raised to $V_{cc}$. Moreover, the signal level of the drain side selected gate line DSG of the memory cell array 101 is set to $V_{cc}$. The signal level of the source side selected gate line SSG is set to GND. The voltage of the channel CH0 of the memory cell transistors of the memory string A0 and the voltage of the channel CHI of the memory cell transistors of the memory string A1 are raised to ($V_{cc}$-VthDSG) (where VthDSG is a threshold voltage of each of the selected transistors DS0 and DS1).

Thereafter, a memory string to which data is written is selected with the address decode signals AiB and AiN. In this example, it is assumed that the memory string A0 has been selected as a memory string to which data is written. In this example, the control signal Vref is set to a predetermined voltage at which the transistor P101 allows a current necessary for compensating a leak current of the bit BL0 and so forth to flow (for example, the predetermined voltage is 2 V). In addition, the signal level of the address decode signal AiN is set to low (GND). Thus, the transistor HN104 is turned off. The non-selected side bit line BL1 is raised to $V_{cc}$ and kept in a floating state. The channel CH1 of the memory cell transistors of the memory string A1 is kept at ($V_{cc}$-VthDSG).

After a predetermined time period elapses, the signal level of the control signal PGM is set to high. Thus, the transistor N102 is turned on. Consequently, the selected bit BL0 and the bit line voltage generating circuit 102 are connected. The selected bit BL0 is set to a voltage corresponding to the write data.

When write data is "00x" (where x is 0 or 1), the transistors N103 and N104 are turned on. Thus, a current path denoted by PATH1 shown in FIG. 3 is formed. The bit BL0 is connected to the ground line. Consequently, the voltages of the bit BL0 and the channel CH0 of the memory cell transistors of the memory string A0 are lowered to the GND level.

When the write data is "01x" (where x is 0 or 1), the transistors N105 and N106 are turned on. Thus, a current path denoted by PATH2 shown in FIG. 3 is formed. The bit BL0 is connected to the bit line voltage supplying line VBL1. Thus, the voltages of the bit BL0 and the channel CH0 of the memory cell transistors of the memory string A0 are lowered to a voltage VB1 (=1.2 V).

When the write data is "10x" (where x is 0 or 1), the transistors N107 and N108 are turned on. Thus, a current path denoted by PATH3 shown in FIG. 3 is formed. The bit line BL0 is connected to the bit line voltage supplying line VBL2. Thus, the voltages of the bit BL0 and the channel CH0 of the memory cell transistors of the memory string A0 are lowered to a voltage VB2 (=1.5 V).

When the write data is "110" (where x is 0 or 1), the transistors N109, N110, and N111 are turned on. Thus, a current path denoted by PATH4 shown in FIG. 3 is formed. The bit BL0 is connected to the bit line voltage supplying line VBL3. Thus, the voltages of the bit BL0 and the channel CH0 of the memory cell transistors of the memory string A0 are lowered to a voltage VB3 (=1.5 V).

When the write data is "111", no current path is formed. The bit BL0 is not connected to any of the ground line and the bit line supplying lines VBL1 to VBL3. Thus, the voltage of the bit BL0 is kept at $V_{cc}$ in a floating state. The voltage of the channel CH0 of the memory cell transistors of the memory string A0 is kept at $V_{cc}$-VthDSG.

After the selected bit BL0 connected to the selected memory string A0 is set to a voltage corresponding to the write data, a selected word line for a write page of the word lines WL0 to WL15 is set to a write voltage VPGM. The other non-selected word lines are set to a write path voltage Vpss (<VPGM). Thus, data is written to relevant memory cell transistors.

In memory cell transistors whose write data is not "111", Flowler-Nordheim tunneling phenomenon (hereinafter referred to as FN tunning phenomenon) takes place because of an electric field generated by a word line voltage (write voltage VPGM) supplied to the selected word line and the voltage of the channel of the memory cell transistors. Thus, data is written to the respective memory cell transistors. The channel of the memory cell transistor whose write data is "111" and the channel CH1 of the memory cell transistors of the non-selected memory string A1 are disconnected from the bit lines BL0 and BL1 by the drain side selected transistors DS0 and DS1. Because of a capacity coupling with word lines, these channels are boosted to a non-write voltage. Thus, no data is written to these memory cell transistors.

In the above-described eight-value type NAND flash memory, since write data in different write levels are written, the write time period is shorter than the case that write data in each level is written step by step.

In a NAND flash memory, when data is written, a word line voltage (as a write pulse with a predetermined pulse width) is written to a selected word line. By repeating the writing cycle, data is written to memory cells part by part. In this case, from a view point of the decrease of the number of times of the writing operation, the voltage of word lines is set to a predetermined initial voltage. Thereafter, the voltage is gradually raised with a predetermined step width. This method is referred to as ISPP (Incremental Step Pulse Programming) method.

However, in the above-described eight-value type NAND flash memory, when multi-value data is written in parallel, to prevent the memory cell transistors for write data "110" from overwriting because the difference between the ideal voltage of bit lines and the real voltage of bit lines is maximum, the voltage of a memory cell transistor that has the highest writing speed in these transistors should be set to a value so that the first writing operation causes the memory cell transistor with the highest writing speed to be in the write level. In this case, since the initial value of the voltage of the word lines is lowered by the difference between the ideal voltage of the word lines and the real voltage thereof, the electric field of a memory cell to which data whose write level is higher than that for write data "110" is written is lower than that in the ideal state. (At present time, the initial voltage in the ISPP operation is for example, 15 V. When the write data is "110", the difference between the real voltage of the bit lines and the ideal voltage thereof is 3.6 V–1.5 V 2.1 V. In this case, the ideal voltage in the initial state of the ISPP operation is around 17 V). Thus, the number of times of writing operation becomes large and thereby the write time becomes long.

SUMMARY OF THE INVENTION

Therefore, an object of the present invention is to provide a nonvolatile semiconductor device and a data writing method that perform a multi-value parallel writing operation by varying the voltage of bit lines corresponding to write data in a short write time.

To accomplish the above-described object, a first aspect of the present invention is a nonvolatile semiconductor storage device having memory cells for storing data corresponding to threshold voltages that vary corresponding to the amount of electric charge stored in electric charge storing portions, the amount o electric charge varying corresponding to voltages supplied to word lines and bit lines, multi-value data of n bits (where n≧2) being written in parallel and page by page to the memory cells, the device comprising a write controlling means for supplying a voltage for word lines as a pulse signal to memory cells and controlling the pulse width of the effective voltage of word lines corresponding to a substantial write time period of data written to the memory cells.

A second aspect of the present invention is a data writing method for a nonvolatile semiconductor storage device having memory cells for storing data corresponding to threshold voltages that vary corresponding to the amount of electric charge stored in electric charge storing portions, the amount of electric charge varying corresponding to voltages supplied to word lines and bit lines, multi-value data of n bits (where n≧2) being written in parallel and page by page to the memory cells, the method comprising the step of supplying a voltage for word lines as a pulse signal to memory cells and controlling the pulse width of the effective voltage of word lines corresponding to a substantial write time period of data written to the memory cells.

The nonvolatile semiconductor storage device according to the present invention is typically an NAND flash memory. Each of the memory cells of the NAND flash memory is composed of an MOS transistor having a floating gate and a control gate.

The nonvolatile semiconductor storage device preferably further comprises a plurality of memory strings disposed in parallel, each of the memory strings having a plurality of the memory cells, first ends and second ends of the memory strings being connected to bit lines and source lines through a selected transistor whose conduction state is controlled corresponding to a gate voltage, control gates of memory cells on the same line being connected with a common word line, the multi-value data of n bits (where n≧2) being written in parallel and page by page to the memory cells by self boost or local-self boost.

Next, the theory of operation of the present invention will be described.

FIG. 5 is a graph showing a pulse width dependency of voltages of word lines (write pulses) against the variation of threshold voltages of memory cells in the case that data is written to an NAND flash memory according to the ISPP method. In FIG. 5, the horizontal axis represents the number of times of the writing operation, whereas the vertical axis represents the threshold voltages of the memory cells. In FIG. 5, measured values of threshold voltages Vth against pulse widths 2 μs, 5 μs, 10 μs, 20 μs, and 50 μs of the word line voltages by black dots and calculated values thereof are denoted by solid lines. In any case, the initial value of the voltages of the word lines is 14.5 V. The step value of the voltages of the word lines per writing cycle is 0.5 V. Thus, the horizontal axis of FIG. 5 corresponds to the voltages of the word lines of the writing cycle.

FIG. 5 shows that in the writing operation of an NAND flash memory, assuming that the initial value and the step width of voltages of word lines as pulse signals are not varied and the pulse width thereof is varied, the threshold voltages Vth of the memory cells are proportional to the pulse width of the voltages of the word lines in the first several writing cycles. Thereafter, regardless of the pulse width of the voltages of the word lines, the threshold voltages Vth of the memory cell shift (rise) corresponding to the step width of the voltages of the word lines. In other words, regardless of the electric field in the writing state to the memory cells, the shifting of the threshold voltages Vth of the memory cells can be delayed reversely proportional to the pulse width of the voltages of the word lines (the applying time period of the voltages of the word lines). Thus, when the pulse width of the voltages of the word lines is short, the writing operation is performed at higher voltages than the real voltages of the bit lines.

Next, the multi-value parallel writing operation of which the pulse width of the voltages of the word lines is controlled corresponding to write data in an eight-value type NAND flash memory will be described.

As shown in FIG. 6, in the eight-value type NAND flash memory, the threshold voltages Vth of the memory cell transistors are in eight states (distribution 7 to distribution 0) corresponding to data "000", "001", "010", "011", "100", "101", "110", and "111", respectively. In FIG. 6, VVF1, VVF2, VVF3, VVF4, VVF5, VVF6, and VVF7 represent voltages of selected word lines in verifying operations corresponding to these states. On the other hand, VRD1, VRD2, VRD3, VRD4, VRD5, VRD6, and VRD7 represent voltages of selected word lines in normal reading operations corresponding to these states. The voltages of the selected word lines have the relation of VVF7>VRD7>VVF6>VRD6>VVF5>VRD5>VVF4>VRD4>VVF3>VRD3>VVF2>VRD2>VVF1>VRD1. For example, VVF7=3.8 V, VRD7=3.6 V, VVF6=3.2 V, VRD6=3.0 V, VVF5=2.6 V, VRD5=2.4 V, VVF4=2.0 V, VRD4=1.8 V, VVF3=1.4 V, VRD3=1.2 V, VVF2=0.8 V, VRD2=0.6 V, VVF1=0.2 V, VRD1=0 V.

In the eight-value type NAND flash memory, without considering self-boost method or local self-boost method, as shown in column (a) of FIG. 6, in the ideal writing operation, when write data is "000", the voltage of bit lines is 0 V; when write data is "001", the voltage of bit lines is 0.6 V; when write data is "010", the voltage of bit lines is 1.2 V; when write data is "011", the voltage of bit lines is 1.8 V; when write data is "100", the voltage of bit lines is 2.4 V; when write data is "101", the voltage of bit lines is 3.0 V; when write data is "110", the voltage of bit lines is 3.6 V; and when write data is "111", the voltage of bit lines is 8 V.

Actually, in the writing operation of the eight-value type NAND flash memory, the channel of write-prohibited memory cells is disconnected from bit lines. The memory cells are capacity-coupled with word lines and thereby boosted to a non-write voltage. In other words, the so-called self-boost method or local self-boost method is used. In the writing operation, as shown in column (b) of FIG. 6, when write data is "00x" (where x is 0 or 1), the voltage of bit lines is set to 0 V; when write data is "01x" (where x is 0 or 1), the voltage of bit lines is set to 1.2 V; when write data is "10x" (where x is 0 or 1), the voltage of bit lines is set to 1.5 V; when write data is "110", the voltage of bit lines is set to 1.5 V; and when write data is "111", the voltage of bit lines is set to $V_{cc}$.

In the eight-value type NAND flash memory, when the pulse width of the voltage of word lines for write data "110" or "10x" (where x is 0 or 1) in a lower write level is set to a smaller value than the pulse width of the voltage of word lines for writing data "0xx" (where x is 0 or 1) in a higher write level, the voltage of bit lines for writing data "110" or "10x" (where x is 0 or 1) is equivalent to the state that the voltage of bit lines is set to a voltage higher than the real voltage. Thus, when data is written according to the ISPP method, the voltages of word lines in the initial state of the wiring operation can be set to higher voltages.

When data is written to memory cells of the above-described eight-value type NAND flash memory, the shift amount of a threshold voltage after the erase state until the completion of the writing operation is proportional to the write level of a memory cell. Thus, the writing operation of a memory cell to which data in a low write level is written is quickly completed. Even if a short pulse width is set for the voltage of a word line, when the pulse width is properly selected, the total writing time period does not prolong.

Thus, as the write level of data is low, it is preferred that the pulse width of the voltage of word lines is set to a small value.

In a NAND flash memory, a voltage with a predetermined pulse width is applied to a selected word line and data for one page is written to memory cells at a time. Thus, when data is written to memory cells with a pulse whose pulse width is shorter than a pulse of a voltage applied to the selected word line, even if the voltage is applied to the selected word line, it is necessary to prevent data from being written to the memory cells for a predetermined time period. In this case, the time period for which data is actually written to memory cells (namely, the effective pulse width of the voltages of the word lines) is set to a value shorter than the pulse width of the voltage supplied to the selected word line.

In other words, in the state that the power supply voltage $V_{cc}$ is supplied to a selected bit line connected to a write memory cell (however, it is assumed that the gate voltage of the drain side selected transistor of the memory string is set to the power supply voltage $V_{cc}$), as with non-write memory cells, after the voltages of word lines are raised, the channel of the write memory cell is boosted to the non-write voltage by the self-boost method or local self-boost method. After a predetermined time period has elapsed, the voltage of bit lines is changed corresponding to the write data. Thus, the channel of the write memory cell is lowered corresponding to the write data through the bit lines. Thereafter, data is written until the end of the write cycle. At this point, when the voltage changing timing to the voltage of the bit lines corresponding to write data is delayed corresponding to the write level of the write data, the pulse width of the voltage of the word lines is proportional to the write level of data written to the memory cells.

In FIG. 5, in the case that the voltages of the word lines are the same, the difference between threshold voltages Vth corresponding to different pulse widths in the fifth writing cycle is as follows:

(A) The difference between the threshold voltage Vth corresponding to a pulse width of 20 $\mu$s and the threshold voltage Vth corresponding to a pulse width of 10 us is 0.7 V.

(B) The difference between the threshold voltage Vth corresponding to a pulse width of 20 $\mu$s and the threshold voltage Vth corresponding to a pulse width of 5 $\mu$s is 1.1 V.

(C) The difference between the threshold voltage Vth corresponding to a pulse width of 20 $\mu$s and the threshold voltage Vth corresponding to a pulse width of 2 $\mu$s is 1.7 V.

When the pulse width of the write pulse applied to the selected word line is 20 $\mu$s, corresponding to the relations (A), (B), and (C), the pulse width (supplying time) of the word line voltage is set corresponding to write data.

In reality, when the pulse width of a voltage supplied to a selected word line is 20 $\mu$s and the voltage of bit lines in the multi-value parallel writing operation is set as shown in (column (b) of FIG. 6, the effective pulse width of the word lines is set corresponding to write data as shown in (column (c) of FIG. 6. In other words, when write data is "0xx" (where x is 0 or 1), the effective pulse width of the voltages of word lines is set to 20 $\mu$s; when write data is "10x" (where x is 0 or 1), the effective pulse width of the voltages of word lines is set to 10 $\mu$s; when write data is "110", the effective pulse width of the voltages of word lines is set to 2 $\mu$s. When write data is "111", since data is not substantially written, the effective pulse width of the voltages of word lines is set to 0 $\mu$s.

In this case, when write data is "0xx" (where x is 0 or 1), the effective pulse width of the voltages of word lines is equal to the pulse width of the voltage that is actually supplied to the selected word line. Thus, in the case that the write data is "0xx" (where x is 0 or 1), when the voltages of the word lines are raised, data is substantially written. In contrast, in the case that write data is "10x" (where x is 0 or 1) or write data is "110", since the effective pulse width of the voltages of word lines is shorter than the pulse width of the voltage supplied to the selected word line, when write data is "10x" (where x is 0 or 1), the data is substantially written 10 $\mu$s after the voltages of word lines are raised. When write data is "110", data is substantially written 18 $\mu$s after the voltages of word lines are raised.

When the voltage of bit lines in the multi-value parallel writing operation is set as shown in column (b) of FIG. 6 and the effective pulse width of the voltage of word lines is set as shown in column (c) of FIG. 6, the substantial voltage of bit lines (equivalent voltage of bit lines) is obtained as shown in column (d) of FIG. 6 assuming that the write time period of all data is 20 $\mu$s corresponding to the relations (A), (B), and (C). In other words, when write data is "00x" (where x is 0 or 1), the equivalent voltage of bit lines is 0+0=0 V; when write data is "01x" (where x is 0 or 1), the equivalent voltage of bit lines is 1.2+0=1.2 V; when write data is "10x" (where x is 0 or 1), the equivalent voltage of bit lines is 1.5+0.7=2.2 V; and when write data is "110", the equivalent voltage of bit lines is 1.5+1.7=3.2 V.

Column (e) of FIG. 6 shows the difference between the voltage of bit lines in the ideal writing operation shown in column (a) of FIG. 6 and the equivalent voltage of bit lines shown in column (d) of FIG. 6. When the effective pulse width of the voltage of word lines are not controlled corresponding to write data (in other words, the write time periods of all data are the same), the difference between the ideal voltage of bit lines and the equivalent voltage of bit lines becomes maximum for write data "110". At this point, the difference between the ideal voltage of bit lines and the equivalent voltage of bit lines is 2.1 V. On the other hand, when the effective pulse width of the voltage of word lines is controlled corresponding to write data so as to perform the multi-value parallel writing operation, the difference between the ideal voltage of bit lines and the equivalent voltage of bit lines becomes maximum for write data "101". At this point, the difference between the ideal voltage of bit lines and the equivalent voltage of bit lines is 0.8 V. In this case, the voltages of word lines in the initial writing state are set to voltages of which a memory cell that has the highest write speed in memory cells for write data "101" becomes the write level in the first writing cycle. Thus, the voltages of word lines are set to voltages lower than the ideal voltage by 0.8 V. In contrast, when the pulse width of the voltage of word lines is not substantially controlled corresponding to write data (in other words, the write time periods of all data are the same (for example, 20 $\mu$s)), the difference between the ideal voltage of bit lines and the real voltage of bit lines becomes maximum for write data "110". The difference is 2.1 V.

As described above, in to the nonvolatile semiconductor storage device and the data writing method thereof according to the present invention, voltages as pulses are supplied to word lines so as to write data to memory cells. At this point, since the effective pulse width of the voltage of word lines corresponding to the data writing time period for data written to write memory cells is controlled corresponding to write data, the voltage of word lines in the initial writing state can be set to high.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Next, with reference to the accompanying drawings, an embodiment of the present invention will be described.

Figure 7:
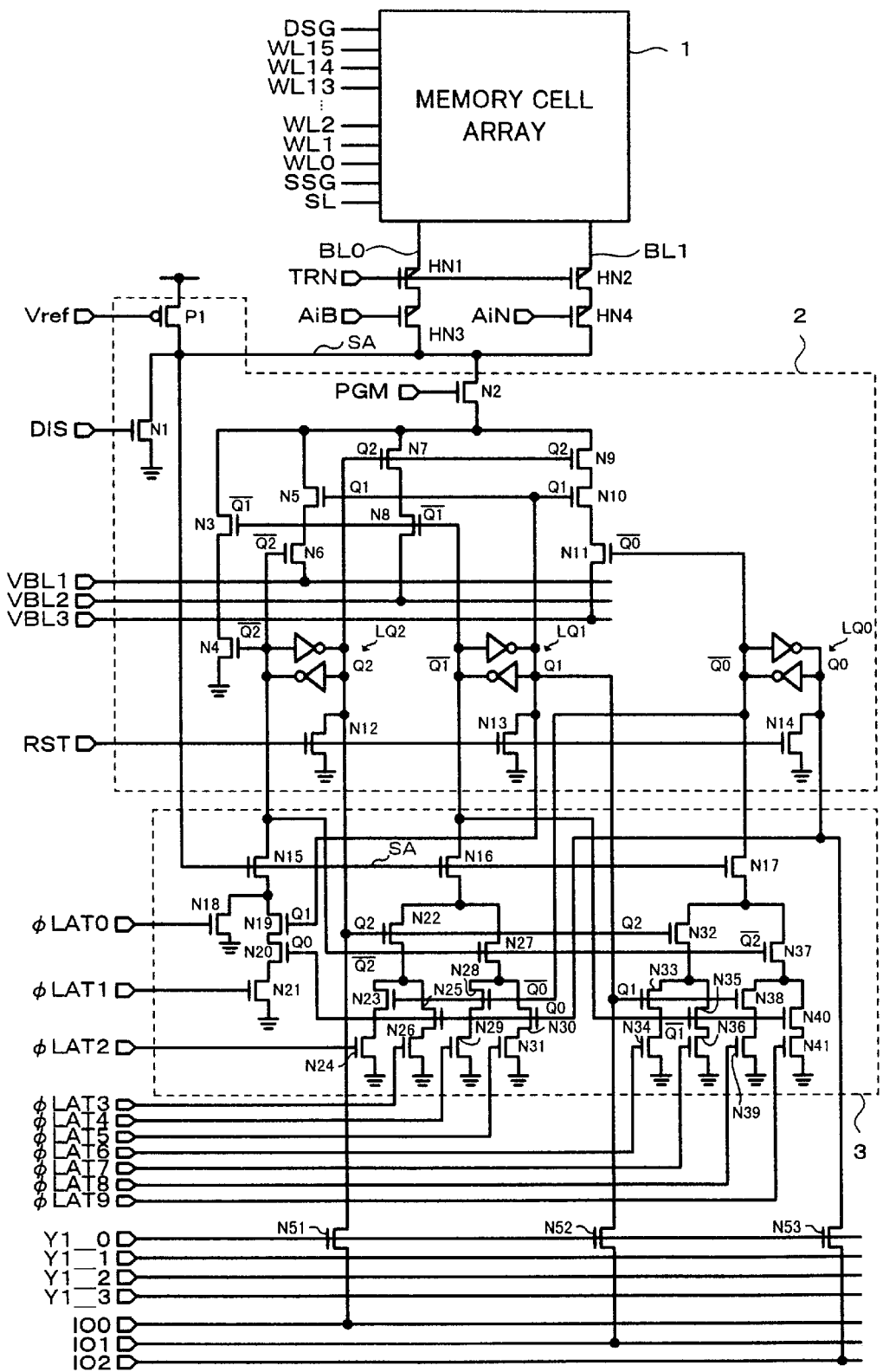
FIG. 7 is a circuit diagram showing the structure of principal portions of an eight-value type NAND flash memory according to an embodiment of the present invention.
Figure 8:
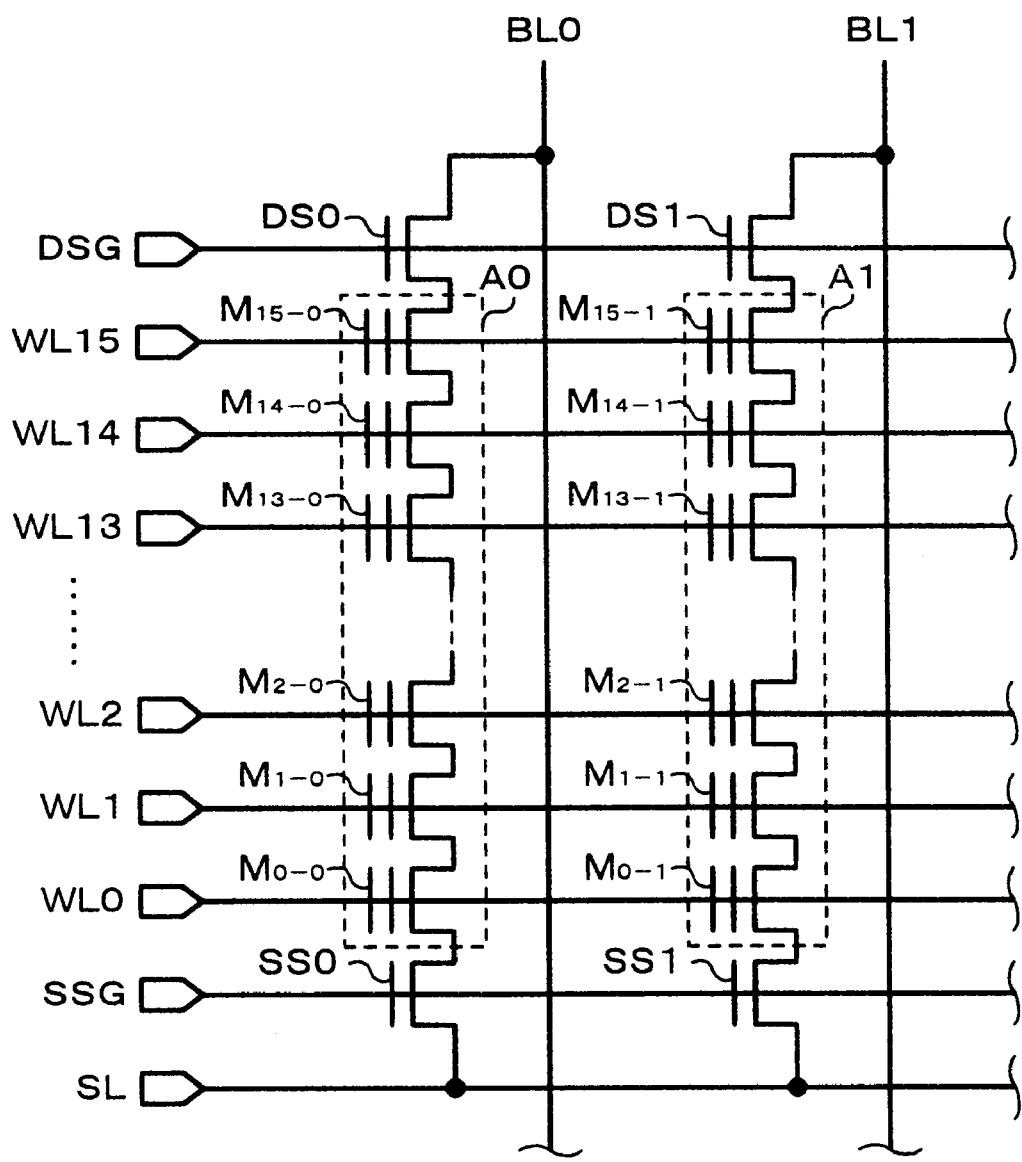
FIG. 8 is an equivalent circuit diagram of a memory cell array of the eight-value type NAND flash memory according to the embodiment of the present invention.

FIGS. 7 and 8 show the structure of an eight-value type NAND flash memory according to an embodiment of the present invention. FIG. 7 shows the structure of principal portions of the eight-value type NAND flash memory. FIG. 8 shows an equivalent circuit of a memory cell array of the eight-value type NAND flash memory. The NAND flash memory comprises a memory cell array 1, a bit line voltage generating circuit 2, and a reading/verifying controlling circuit 3.

As shown in FIG. 8, the memory cell array 1 has MOS transistors (memory cell transistors) disposed in a matrix shape. Each of the MOS transistors has for example a floating gate (FG) and a control gate (CG) and functions as a three-bit memory cell. The control gates of memory cell transistors of the same lines are connected to common word lines WL0 to WL15. Memory cell transistors on the same rows are memory strings A0 to An. In FIG. 8, only the memory strings A0 and A1 are shown. The other memory strings A2 to An are omitted.

Thus, each memory string is composed of a plurality of memory cell transistors disposed in series. A memory string A0 is composed of memory cell transistors $M_{0-0}$ to $M_{15-0}$. The drain of the memory cell transistor $M_{15-0}$ is connected to the source of a selected transistor DS0. The drain of the selected transistor DS0 is connected to a bit BL0. The source of the memory cell transistor $M_{0-0}$ is connected to the drain of a selected transistor SS0. The source of the selected transistor SS0 is connected to a source line SL. The control gates of the memory cell transistors $M_{0-0}$ to $M_{15-0}$ are connected to word lines WL0 to WL15, respectively. Likewise, the memory string A1 is composed of memory cell transistors $M_{0-1}$ to $M_{15-1}$. The drain of the memory cell transistor $M_{15-1}$ is connected to the source of a selected transistor DS1. The drain of the selected transistor DS1 is connected to a bit line BL1. The source of the memory cell transistor $M_{0-1}$ is connected to the drain of a selected transistor SS1. The source of the selected transistor SS1 is connected to the source line SL. The control gates of the memory cell transistors $M_{0-1}$ to $M_{15-1}$ are connected to the word lines WL0 to WL15, respectively.

In such a manner, the memory strings A0 and A1 are connected to various lines. These connection relations apply to the other memory strings A2 to An. Thus, first terminals of the memory strings A0 to An are connected to the bit lines BL0 to BLn through the selected transistors SS0 to SSn, respectively. The other terminals of the memory strings A0 to AN are connected to the source line SL through the selected transistors SS0 to SSn, respectively. The gates of the selected transistors DS0 to DSn are connected to a common drain side selected gate line DSG. The gates of the selected transistors SS0 to SSn are connected to a common source side selected gate line SSG. In the memory array 101, the memory strings A0 to An are disposed in parallel.

A bit line voltage generating circuit 2 is disposed corresponding to the bit lines BL0 and BL1. As shown in FIG. 7, the bit line voltage generating circuit 2 is composed of transistors N1 to N14, latch circuits LQ2, LQ1, and LQ0, and a transistor P1. Each of the transistors N1 to N14 is composed of an n channel MOS transistor. Each of the latch circuits LQ2, LQ1, and LQ0 is composed of two invertors of which the input of the first inverter is connected to the output of the second inverter and of which the input of the second inverter is connected to the output of the first inverter. The transistor P1 is composed of a p channel MOS transistor. The bit line voltage generating circuit 2 is connected to bit line voltage supplying lines VBL1, VBL2, and VBL3 connected to respective constant voltage sources. In the NAND flash memory, two bit lines are selectively connected to the bit line voltage generating circuit 2 having the latch circuits LQ2 to LQ0. This structure is referred to as a bit line shared structure. This structure applies to other bit line voltage generating circuits corresponding to other bit lines BL2 to BLn. For simplicity, the description of the other bit line voltage generating circuits will be omitted. Likewise, only circuit portions corresponding to the bit lines BL0 and BL1 will be described.

The bit line voltage generating circuit 2 generates a voltage of bit lines corresponding to write data. The generated voltage is supplied to a channel of memory cell transistors of the memory cell array 1 through the bit lines BL0 to BL1. In data verifying mode, when data is sufficiently written to memory cell transistors of the memory cell array 1, storage nodes Q2, Q1, and Q0 of latch circuits LQ2, LQ0, and LQ0 of the bit line voltage generating circuit 2 are set to "111". In data reading mode, threshold voltages of memory cell transistors of the memory cell array 1 are detected and thereby data is read. At this point, data that has been read is decoded and set to the storage nodes Q2, Q1, and Q0 of the latch circuits LQ2, LQ1, and LQ0.

The reading/verifying controlling circuit 3 is composed of transistors N15 to N41 that are n channel MOS transistors. In a data reading state or data verifying state, the reading/verifying controlling circuit 3 controls the states of the latch circuits LQ2, LQ1, and LQ0. The reading/verifying controlling circuit 3 is connected to supplying lines for control signals φLAT0 to φLAT9. Pulse signals are supplied to the supplying lines for the control signals φLAT0 to φLAT9.

Transistors HN1 and HN3 are connected in series between the bit BL0 and the node SA. Each of the transistors HN1 and HN3 are composed of an n channel MOS transistor with a high withstand voltage. Likewise, transistors HN2 and HN4 are connected in series between the bit line BL1 and the node SA. Each of the transistors HN2 and HN4 is composed of an n channel MOS transistor with a high withstand voltage. A common control signal TRN is supplied to the gates of the transistors HN1 and HN2. An address decode signal AiB is supplied to the gate of the transistor HN3. An address decode signal AiN is supplied to the gate of the transistor HN4.

In the bit line voltage generating circuit 2, a transistor PI is connected between the node SA and a power supplying line of the power supply voltage $V_{cc}$ (for example, $V_{cc}$=3.3 V). A control signal Vref is supplied to the gate of the transistor P1. A transistor N1 is connected between the node SA and a ground line. A control signal DIS is supplied to the gate of the transistor N1.

In the bit line voltage generating circuit 2, the drain of the transistor N102 is connected to the node SA. The source of the transistor N2 is connected to the drains of transistors N3, N5, N7, and N9. A control signal PGM is supplied to the gate of the transistor N2.

The transistors N3 and N4 are connected in series between the source of the transistor N2 and the ground line. The transistors N5 and N6 are connected in series between the source of the transistor N2 and the bit line voltage supplying line VBL1. The transistors N7 and N8 are connected in series between the source of the transistor N2 and the bit line voltage supplying line VBL2. The transistors N9, N10, and N11 are connected in series between the source of the transistor N2 and the bit line voltage supplying line VBL3. In the NAND flash memory according to the embodiment, the power supply for a GND level voltage of bit lines is supplied with a ground line. Alternatively, with a bit line voltage supplying line (for example, VBL0) for supplying a GND level voltage of bit lines, the transistors N3 and N4 may be connected in series between the source of the transistor N2 and the bit line voltage supplying line VBL0.

The latch circuits LQ2, LQ1, and LQ0 have storage nodes Q2, Q1, and Q0 and their inverted storage nodes /Q2, /Q1, and /Q0, respectively (where "/" is a bar representing an inversion).

The inverted storage node /Q2 of the latch circuit LQ2 is connected to the gates of the transistors N4 and N6. The storage node Q2 of the latch circuit LQ2 is connected to the gates of the transistors N7 and N9. The inverted storage node /Q1 of the latch circuit LQ1 is connected to the gates of the transistors N3 and N8. The storage node Q1 of the latch circuit LQ1 is connected to the gates of the transistors N5 and N10. The inverted storage node /Q0 of the latch circuit LQ0 is connected to the gate of the transistor N11.

In addition, transistors N12, N13, and N14 are connected between the storage node Q2 of the latch circuit LQ2 and the ground line, between the storage node Q1 of the latch circuit LQ1 and the ground line, and between the storage node Q0 of the latch circuit LQ0, respectively. A reset signal RST is supplied to the gates of the transistors N12, N13, and N14.

In the reading/verifying controlling circuit 3, the gates of the transistors N15, N16, and N17 are connected to the node SA of the bit line voltage generating circuit 2. The drain of the transistor N15 is connected to the inverted storage node /Q2 of the latch circuit LQ2. The drain of the transistor N16 is connected to the inverted storage node /Q1 of the latch circuit LQ1. The drain of the transistor N17 is connected to the inverted storage node /Q0 of the latch circuit LQ0.

A transistor N18 is connected between the source of the transistor N15 and the ground line. In addition, transistors N19, N20, and N21 are connected in series between the source of the transistor N15 and the ground line.

The source of the transistor N16 is connected to the drain of a transistor N22 and the drain of a transistor N27. Transistors N23 and N24 are connected in series between the source of the transistor N22 and the ground line. In addition, transistors N25 and N26 are connected in series between the source of the transistor N22 and the ground line. Transistors N28 and N29 are connected in series between the source of a transistor N27 and the ground line. In addition, transistors N30 and N31 are connected in series between the source of the transistor N27 and the ground line.

The source of the transistor N17 is connected to the drain of a transistor N32 and the drain of a transistor N37. Transistors N33 and N34 are connected in series between the source of the transistor N32 and the ground line. In addition, transistors N35 and N36 are connected in series between the source of the transistor N32 and the ground line. Transistors N38 and N39 are connected in series between the source of the transistor N37 and the ground line. In addition, transistors N40 and N41 are connected in series between the source of the transistor N37 and the ground line.

The reading/verifying controlling circuit 3 has supplying lines for control signals φLAT0 to φLAT9. The control signal φLAT0 is supplied to the gate of the transistor N18. The control signal φLAT1 is supplied to the gate of the transistor N21. The control signal φLAT2 is supplied to the gate of the transistor N24. The control signal φLAT3 is supplied to the gate of the transistor N26. The control signal φLAT4 is supplied to the gate of the transistor N29. The control signal φLAT5 is supplied to the gate of the transistor N31. The control signal φLAT6 is supplied to the gate of the transistor N34. The control signal φLAT7 is supplied to the gate of the transistor N36. The control signal φLAT8 is supplied to the gate of the transistor N39. The control signal φLAT9 is supplied to the gate of the transistor N41.

The inverted storage node /Q2 of the latch circuit LQ2 is connected to the gates of the transistors N27 and N37. The storage node Q2 of the latch circuit LQ2 is connected to the gates of the transistors N22 and N32. The inverted storage node /Q1 of the latch circuit LQ1 is connected to the gates of the transistors N35 and N40. The storage node Q1 of the latch circuit LQ1 is connected to the gates of the transistors N33 and N38. The inverted storage node /Q0 of the latch circuit LQ0 is connected to the gates of the transistors N28 and N23. The storage node Q0 of the latch circuit LQ0 is connected to the gates of the transistors N30, N25, and N20.

A transistor N51 is connected between the storage node Q2 of the latch circuit LQ2 and a bus line IO0. A transistor N52 is connected between the storage node Q1 of the latch circuit LQ1 and a bus line IO1. A transistor N53 is connected between the storage node Q0 of the latch circuit LQ0 and a bus line IO2. In addition, the gates of the transistors N51, N52, and N53 are connected as column gates to a supplying line for a signal Y1_0.

The NAND flash memory has several voltage rising circuits and their controlling circuits (not shown). The voltage rising circuits generate particular voltages supplied to various signal lines. These controlling circuits control the respective voltage rising circuits. In reality, the NAND flash memory has voltage rising circuits that generate a write voltage VPGM, a write pass voltage Vpass, and a P5 V voltage (read pass voltage ranging from 5 V to 6 V).

Figure 1:
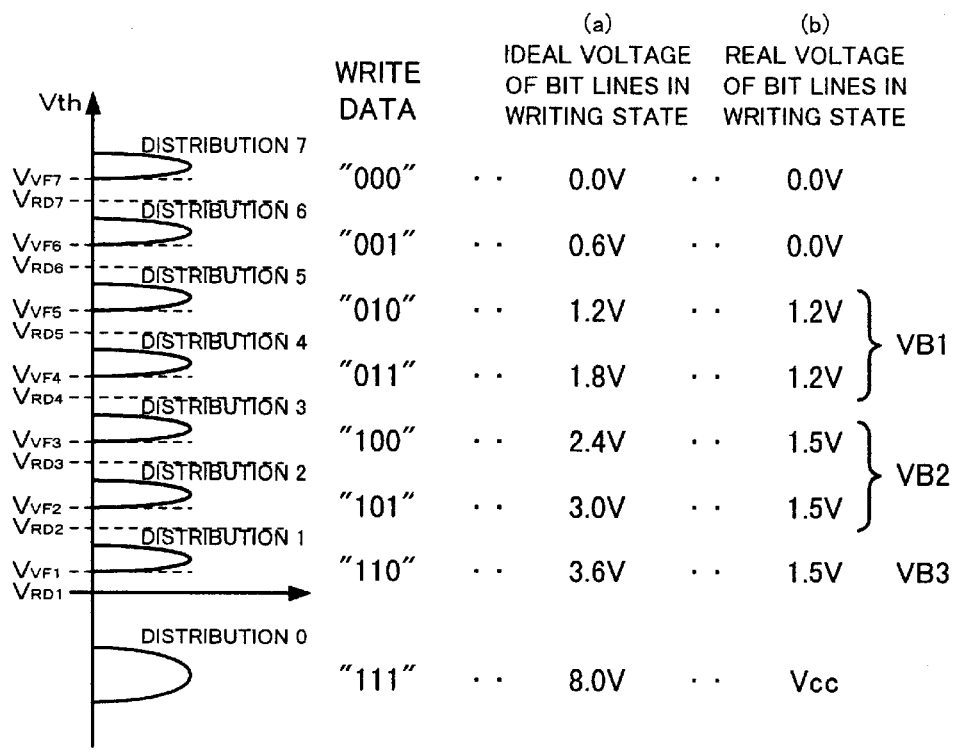
FIG. 1 is a schematic diagram for explaining the relation between data and threshold voltages in the case that data of three bits representing eight values is stored to one memory cell transistor and for explaining examples of an ideal voltage of bit lines and a real voltage of bit lines in a data writing state.
Figure 2:
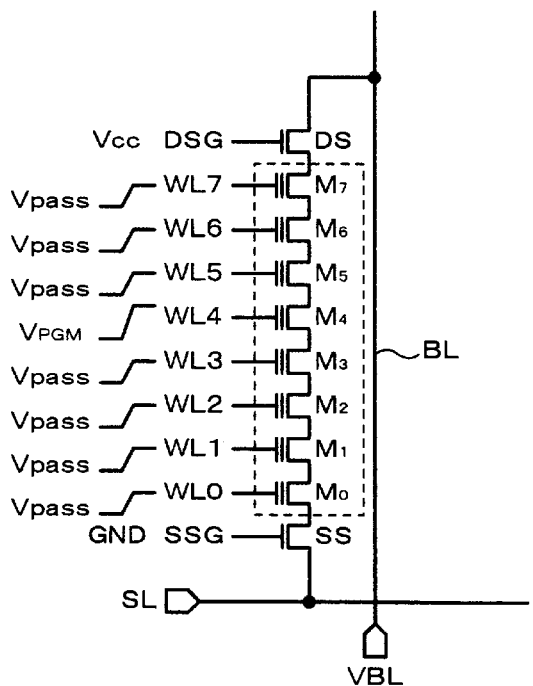
FIG. 2 is an equivalent circuit for explaining a writing operation according to a self-boost method.
Figure 3:
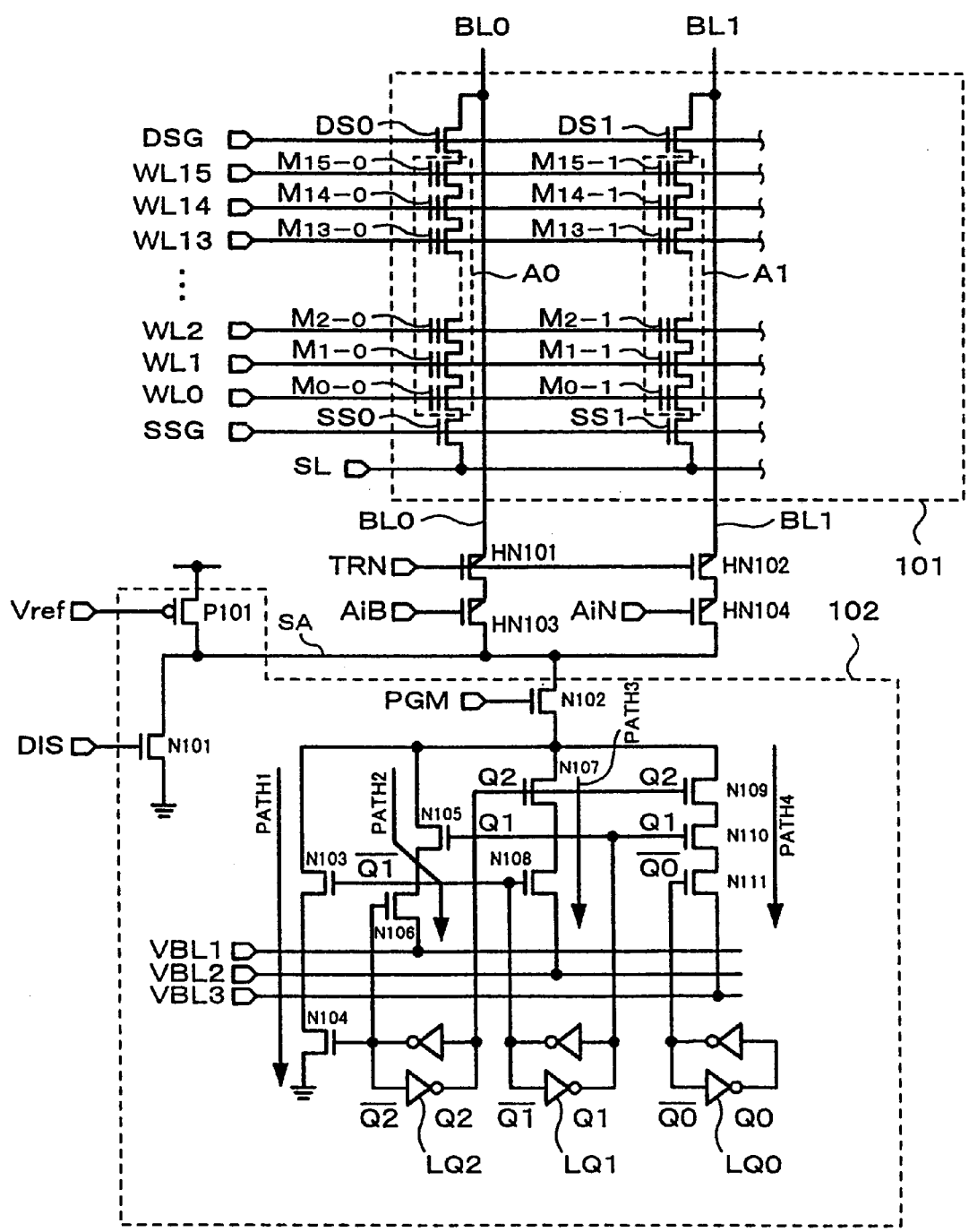
FIG. 3 is a circuit diagram showing the structure of principal portions of an eight-value type NAND flash memory according to the inventor's prior art.
Figure 4:
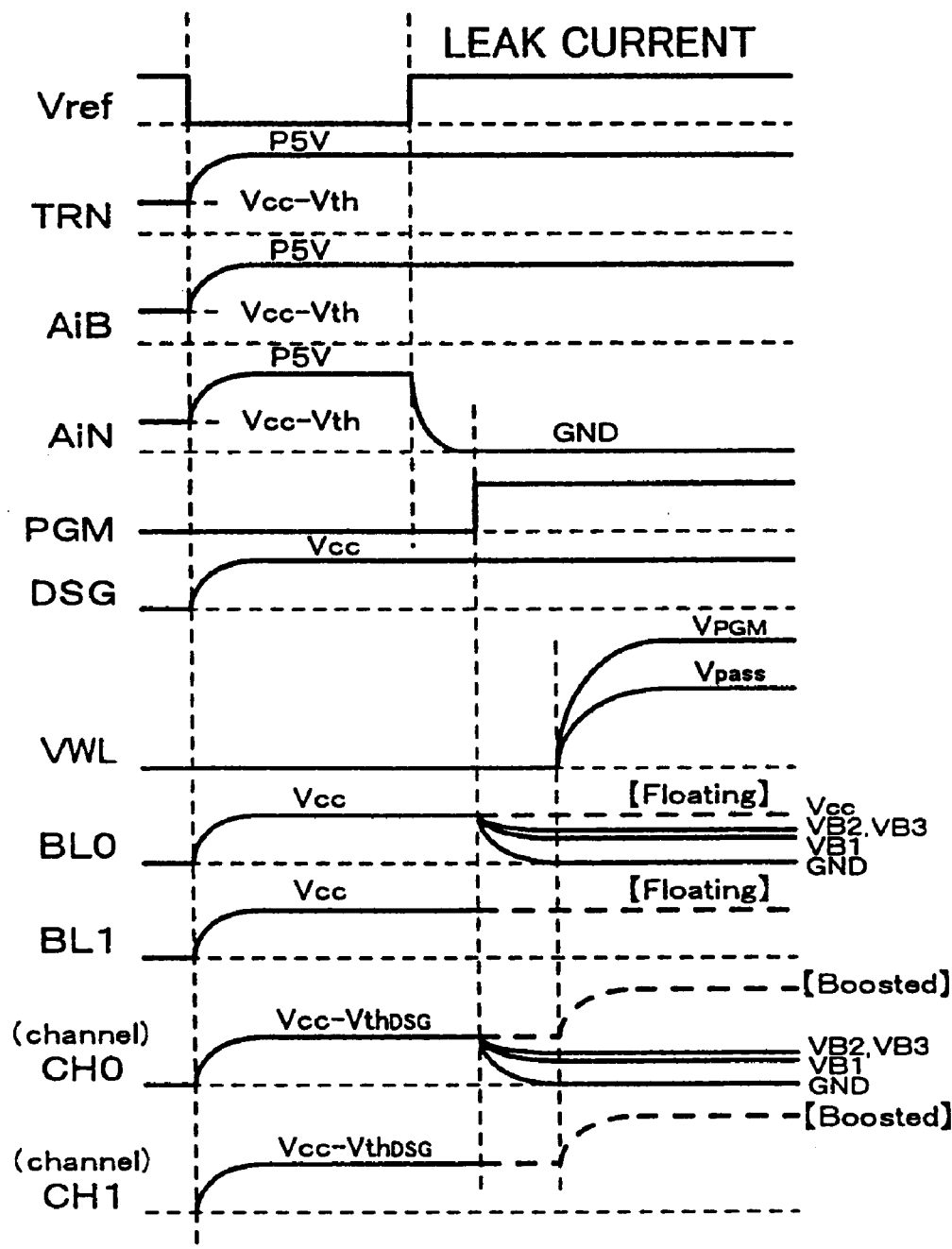
FIG. 4 is a timing chart for explaining a writing operation of an eight-value type NAND flash memory according to the inventor's prior art.
Figure 5:
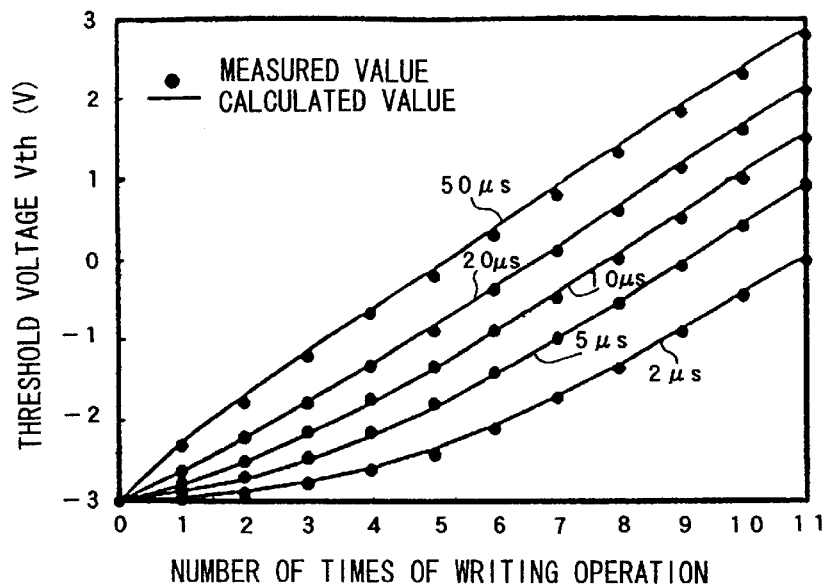
FIG. 5 is a graph showing a pulse width dependency Of voltages of word lines against the variation of threshold voltages of memory cells in the case that data is written to a NAND flash memory according to ISPP method.
Figure 6:
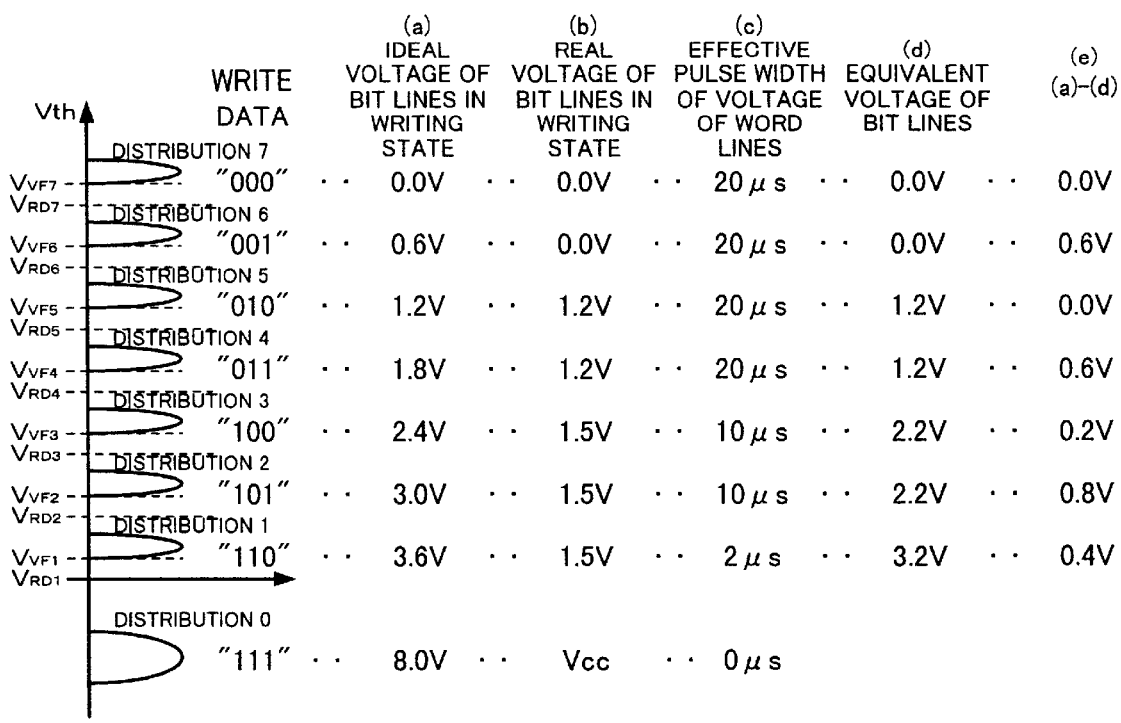
FIG. 6 is a schematic diagram for explaining the theory of operation of the present invention.

In the NAND flash memory according to the embodiment of the present invention, one memory cell transistor stores data of three bits that represents eight values. FIG. 6 shows the relation between distributions of threshold voltages Vth and data of three bits that represent eight values.

In reality, in FIG. 6, distribution 7 is a distribution of a seventh plus threshold voltage Vth for data "000" written to the memory cell transistor. Distribution 6 is a distribution of a sixth plus threshold voltage Vth for data "001" written to the memory cell transistor. Distribution 5 is a distribution of a fifth plus threshold voltage Vth for data "010" written to the memory cell transistor. Distribution 4 is a distribution of a fourth plus threshold voltage Vth for data "011" written to the memory cell transistor. Distribution 3 is a distribution of a third plus threshold voltage Vth for data "100" written to the memory cell transistor. Distribution 2 is a distribution of a second plus threshold voltage Vth for data "101" written to the memory cell transistor. Distribution 1 is a distribution of a first plus threshold voltage Vth for data "110" written to the memory cell transistor. In FIG. 6, distribution 0 is a distribution of a minus threshold voltage Vth for data "111" written as an erase state to the memory cell transistor.

In FIG. 6, VVF1, VVF2, VVF3, VVF4, VVF5, VVF6, and VVF7 represent voltages of selected word lines in verifying operations corresponding to individual states of verifying operation (that will be described later). On the other hand, VRD1, VRD2, VRD3, VRD4, VRD5, VRD6, and VRD7 represent voltages of selected word lines in normal reading operations corresponding to these states. The voltages of the selected word lines have the relation of VVF7>VRD7>VVF6>VRD6>VVF5>VRD5>VVF4>VRD4>VVF3>VRD3>VVF2>VRD2>VVF1>VRD1. For example, VVF7=3.8 V, VRD7=3.6 V, VVF6=3.2 V, VRD6=3.0 V, VVF5=2.6 V, VRD5=2.4 V, VVF4=2.0 V, VRD4=1.8 V, VVF3=1.4 V, VRD3=1.2 V, VVF2=0.8 V, VRD2=0.6 V, VVF1=0.2 V, VRD1=0 V.

Next, the writing operation, the verifying operation, and the normal reading operation of the NAND flash memory according to the embodiment of the present invention will be described.

Figure 9:
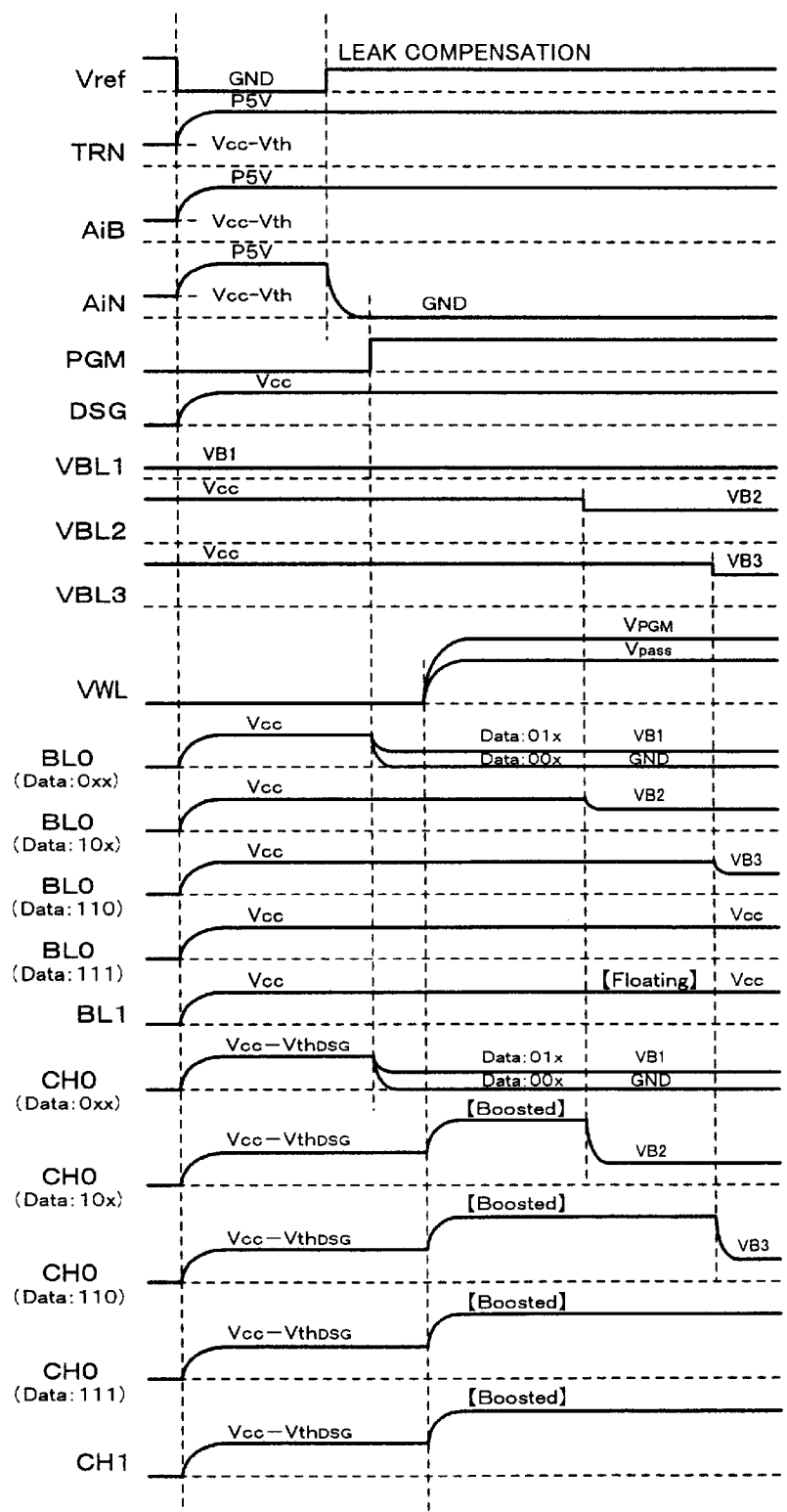
FIG. 9 is a timing chart for explaining a writing operation of the eight-value type NAND flash memory according to the embodiment of the present invention.

First of all, the writing operation of the NAND flash memory will be described. FIG. 9 shows signal states of individual portions in the writing operation of the NAND flash memory according to the embodiment of the present invention. In this example, it is assumed that the memory string A0 has been selected as a write memory string. In the NAND flash memory according to the embodiment, the writing operation and the verifying operation are repeated so as to write desired data to write memory cell transistors. In this example, the ISPP method is used. In the ISPP method, the voltage of word lines is set to an initial voltage. Thereafter, the voltage is gradually raised at a predetermined step width.

Before the writing operation is performed, the signal level of the control signal PGM is set to low (GND). Thus, the transistor N2 is turned off. Consequently, the bit lines BL0 and BL1 are disconnected from the write controlling circuit 2. The signal level of the control signal DIS is set to high ($V_{cc}$). The control signal TRN and the address decode signals AiB and AiN are set to a ($V_{cc}$-Vth) level. At this point, since the transistors HN1, HN2, HN3, and HN4 and the transistor N1 have been turned on, all the bit lines have been grounded. The bit line voltage supplying line VBL1 is set to VB1 (for example, 1.2 V). The signal levels of the bit line voltage supplying lines VBL2 and VBL3 are set to $V_{cc}$.

In such a state, when the writing operation is performed, write data is supplied to the latch circuits LQ2, LQ1, and LQ0 of the bit line voltage generating circuit 2 through the data bus. The write data is latched by the latch circuit LQ2, LQ1, and LQ1. The write data is written corresponding to the latched data of the latch circuits LQ2, LQ1, and LQ0. Thereafter, the signal level of the control signal DIS is set to low. Thus, the bit lines BL0 and BL1 are disconnected from the ground line. The control signal TRN and the address decode signals AiB and AiN are set to a predetermined high level that exceeds $V_{cc}$. For example, the control signal TRN and the address decode signals are set to P5 V. In addition, the signal level of the control signal Vref is set to low (GND). Thus, the voltages of all the bit lines are raised to $V_{cc}$. Moreover, the signal level of the drain side selected gate line DSG of the memory cell array 1 is set to Vc. The signal level of the source side selected gate line SSG is set to GND. The voltage of the channel CH0 of the memory cell transistors of the memory string A0 and the voltage of the channel CH1 of the memory cell transistors of the memory string A1 are raised to ($V_{cc}$-VthDSG) (where VthDSG is a threshold voltage of each of the selected transistors DS0 and DS1).

Thereafter, a memory string to which data is written is selected with the address decode signals AiB and AiN. In this example, it is assumed that the memory string A0 has been selected as a memory string to which data is written. In this example, the control signal Vref is set to a predetermined voltage at which the transistor P1 allows a current necessary for compensating a leak current of the bit BL0 and so forth to flow (for example, the predetermined voltage is 2 V) in the state that the signal level of the bit line voltage supplying line VBL1 is set to VB1 and the signal levels of the bit line voltage supplying lines VBL2 and VBL3 have been set to $V_{cc}$. In addition, the signal level of the address decode signal AiN is set to low (GND). Thus, the transistor HN4 is turned off. The non-selected side bit line BL1 is raised to V and kept in a floating state. The channel CH1 of the memory cell transistors of the memory string A1 is kept at a ($V_{cc}$-VthDSG) level.

After a predetermined time period elapses, the signal level of the control signal PGM is set to high. Thus, the transistor N2 is turned on. Consequently, the selected bit BL0 and the bit line voltage generating circuit 2 are connected. The selected bit BL0 is set to a voltage corresponding to the write data.

At this point, when write data is "00x" (where x is 0 or 1), the transistors N3 and N4 are turned on. Thus, the bit BL0 is connected to the ground line. Consequently, the bit BL0 and the channel CH0 of the memory cell transistor of the memory string A0 are lowered to the GND level.

When the write data is "01x" (where x is 0 or 1), the transistors N5 and N6 are turned on. Thus, the bit BL0 is connected to the bit line voltage supplying line VBL1. Consequently, the bit BL0 and the channel CH0 of the memory cell transistors of the memory string A0 are lowered to the voltage VB1 (=1.2 V).

When write data is "10x" (where x is 0 or 1), the transistors N7 and N8 are turned on. Thus, the bit BL0 is connected to the bit line voltage supplying line VBL2. Consequently, the bit BL0 is kept at $V_{cc}$. The channel CH0 of the memory cell transistors of the memory string A0 is kept at ($V_{cc}$-VthDSG).

When write data is "110", the transistors N9, N10, and N11 are turned on. Thus, the bit BL0 is connected to the bit line voltage supplying line VBL3. Consequently, the bit line BL0 is kept at $V_{cc}$. The channel CH0 of the memory cell transistors of the memory string A0 is kept at ($V_{cc}$-VthDSG).

When write data is "111", no current path is formed. Thus, the bit BL0 is connected to neither the ground line, nor the bit line supplying lines VBL1 to VBL3. Consequently, the voltage of the bit BL0 is raised at $V_{cc}$ and kept in a floating state. The voltage of the channel CH0 of the memory cell transistors of the memory string A0 is kept at ($V_{cc}$-VthDSG).

Thereafter, a voltage as a pulse signal with a pulse width of for example 20 µs is supplied to the word lines. In this case, a selected word line as a write page is set to a write voltage VPGM. The other non-selected word lines are set to a pass voltage Vpass.

At this point, in memory cell transistors whose write data is "00x" (where x is 0 or 1) and whose write data is "01x" (where x is 0 or 1), electric fields of the voltage (write voltage VPGM) applied to the selected word line and the voltage of the channel of the memory cell transistors produce causes FN tunneling effect to take place. Thus, the data is written. Channels of memory cell transistors whose write data is "1x" (where x is 0 or 1), whose write data is "110", and whose write data is "111" and the channel CH1 of the memory cell transistors of the non-selected memory string A1 are disconnected from the bit lines BL0 and BL1 by the drain side selected transistors DS0 and DS1. Because of the capacity coupling with the word lines, the voltage of these memory cell transistors are boosted to a non-write voltage. Thus, data is not written to these memory cell transistors.

Consequently, data is written to only memory cell transistors whose write data is "00x" (where x is 0 or 1) and whose write data is "01x" (where x is 0 or 1).

When a predetermined time period for example 10 µs elapses after the voltage of word lines is supplied, the voltage of the bit line voltage supplying line VBL2 is changed from $V_{cc}$ to VB2 (for example, 1.5 V).

When write data is "10x" (where x is 0 or 1), the voltage of the bit BL0 is lowered to VB2 (=1.5 V). Thus, the selected transistor DS0 is turned on. Consequently, the channel CH0 of the memory cell transistors of the memory string A0 is set to VB2 (=1.5 V). Thus, data is written to a memory cell transistor whose write data is "10x" (where x is 0 or 1). In contrast, data is successively written to memory cell transistors whose write data is "00x" (where x is 0 or 1) and whose write data is "01x" (where x is 0 or 1). The channels of the memory cell transistors whose write data is "110" and whose write data is "111" and the channel CH1 of the memory cell transistors of the non-selected memory string A1 are boosted and kept at the boosted non-write voltage. Thus, data is not written to these memory cell transistors.

Thus, in this period, data is written to memory cell transistors whose write data is "00x" (where x is 0 or 1), whose write data is "01x" (where x is 0 or 1), and whose write data is "10x" (where x is 0 or 1).

When a predetermined time period elapses (for example, 8 µs) after the voltage of the bit line voltage supplying line VBL2 is changed to VB2 (namely, when 18 µs elapses after the voltage of word lines is supplied), the voltage of the bit line voltage supplying line VBL3 is changed from $V_{cc}$ to VB3 (for example 1.5 V).

At this point, when write data is "110", the voltage of the bit BL0 is lowered to VB3 (=1.5 V). Thus, the selected transistor DS0 is turned on. Consequently, the channel CH0 of the memory cell transistors of the memory string A0 is set to VB3 (=1.5 V). Thus, data is written to the memory cell whose write data is "110". Data is continuously written to the memory cell transistors whose write data is "00x" (where x is 0 or 1), whose write data is "01x" (where x is 0 or 1), and whose write data is "10x" (where x is 0 or 1). The channel of the memory cell transistor whose write data is "111" and the channel CH1 of the memory cell transistors of the non-selected memory string A1 are boosted and kept at the non-write voltage. Data are not written to these memory cell transistors.

Thus, in the period, data is written to the memory cell transistors whose write data is "00x" where x is 0 or 1), whose write data is "01x" (where x is 0 or 1), and whose write data is "110".

When 2 $\mu$s elapses after the voltage of the bit line voltage supplying line VBL3 is changed to VB3 (namely, when 20 $\mu$s elapses after the voltage of word lines is supplied), the voltage of word lines is set to 0 V. Thus, the writing cycle is completed.

In the above-described writing operation, in the bit line voltage generating circuit 2, the timing of which the voltage of bit lines is set corresponding to write data is reversely proportional to the write level of data.

In reality, when write data is "00x" (where x is 0 or 1) and write data is "01x" where x is 0 or 1), before the word line voltage is raised, the voltage of the bit BL0 is set to 0 V and VB1 (=1.2 V), respectively. When write data is "10x" (where x is 0 or 1), 10 $\mu$s after the voltage of word lines is raised, the bit BL0 is set to VB2 (=1.5 V). When write data is "110", 18 $\mu$s after the voltage of word lines is raised, the bit BL0 is set to VB3 (=1.5 V). In this case, the time period for which data is substantially written to the memory cell transistors whose write data is "0xx" where x is 0 or 1) is 20 $\mu$s. The time period for which data is substantially written to the memory cell transistors whose write data is "10x" where x is 0 or 1) is 10 $\mu$s. The time period for which data is substantially written to the memory cell transistor whose write data is "111" is 0 $\mu$s. The time period for which data is substantially written corresponds to the effective pulse width (applying time period) of the voltages of word lines.

Thus, in the embodiment of the present invention, the timing of which the voltage of bit lines is set corresponding to write data is controlled corresponding to write data. Consequently, the effective pulse width of the voltage of word lines is controlled corresponding to write data.

Figure 10:
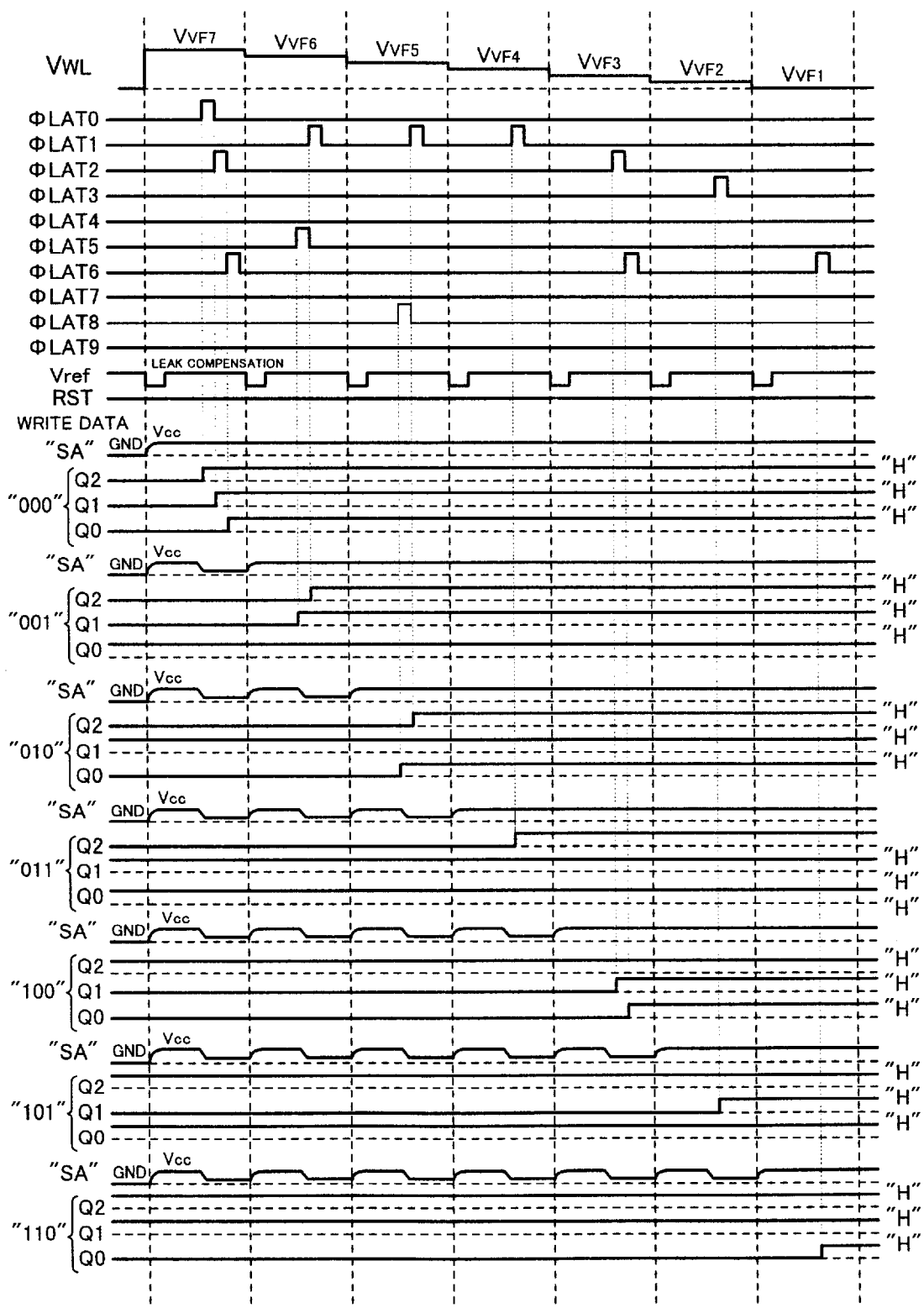
FIG. 10 is a timing chart for explaining a verifying operation of the eight-value type NAND flash memory according to the embodiment of the present invention.

Next, the verifying operation of the NAND flash memory according to the present invention will be described. FIG. 10 shows signal states of individual portions in the verifying operation of the NAND flash memory according to the embodiment of the present invention. In this example, it is assumed that a verifying operation is performed for the memory string A0 after the above-described writing operation is performed.

In the above-described writing operation, after the voltage of word lines VWL is set to GND and thereby one cycle of the writing operation is completed, the signal level of the control signal PGM is changed from the $V_{cc}$ level to the GND level. Thus, the bit BL0 is disconnected from the bit line voltage generating circuit 2. The signal level of the control signal DIS is set to high. The address decode signal AiB and the control signal TRN are kept at the P5V level as with the writing operation. In this period, all the bit lines are grounded. After a predetermined time period has elapsed, the signal level of the control signal TRN is set to GND.

After a predetermined time period has elapsed, the signal level of the control signal DIS is set to GND. The signal level of the address decode signal AiN is set to GND. The non-selected side bit line BL1 is placed in the floating state. The signal level of the control signal TRN is set to ($V_{cc}$-Vth). At this point, since the address decode signal AiB is in the P5 V level, the selected bit BL0 and the node SA are connected.

In the verifying operation, whenever one cycle of the writing operation is completed, threshold voltages corresponding to data "000", "001", "010", "011", "100", "101", and "110" are determined. The threshold voltages are determined in such a manner that after the control signal DIS is changed to the low level, the drain side selected gate line DSG and the source side selected gate line SSG are set to a predetermined high level voltage that is same as the voltage of non-selected word lines (this high level voltage is for example P5 V) and that the voltage VWL of the selected word line is gradually lowered in the order of, for example, VVF7 to VVF6 to VVF5 to VVF4 to VVF3 to VVF2 to VVF1.

Before the threshold voltages of the word lines are determined, the signal level of the control signal Vref is set to low (GND). Thus, the transistor P1 is turned on. Consequently, the power supply voltage $V_{cc}$ is supplied to the bit BL0. After a predetermined time period has elapsed, the voltage of the bit BL0 is raised. When the voltage between the gate and the source of the transistor HN1 becomes Vth' or less (where Vth' is the threshold voltage of the transistor HN1), the transistors HN1 and HN3 are automatically turned off. Thus, the voltage of the bit BL0 is raised to ($V_{cc}$-Vth-Vth') (for example, around 1 V). The node SA is raised to $V_{cc}$.

In such a state, the selected word line is set to a predetermined voltage. In the state that the nodes Q2 to Q0 of the latch circuits LQ2 to LQ0 latch predetermined data, corresponding to the voltage of the bit BL0 and the node SA that depend on a cell current, the threshold voltages are determined. In other words, when a voltage exceeding the threshold voltage Vth of a particular memory cell transistor is supplied to the control gate thereof and thereby a cell current flows, the voltage of the bit BL0 lowers. Thus, the transistors HN1 and HN3 are turned on. Consequently, the voltage of the node SA lowers to nearly the same voltage as ($V_{cc}$-Vth-Vth') of the bit BL0. On the other hand, when a voltage that is lower than the threshold voltage Vth of the particular memory cell transistor is supplied to the control gate thereof, no cell current flows. The voltage of the bit BL0 does not lower. The voltage of the node SA is kept at $V_{cc}$. Correspondingly to such a relation, the threshold voltages Vth are determined.

After the voltage of the bit BL0 is raised, the control signal Vref is set to a voltage at which the transistor P1 to allow a current necessary for compensating a leak current of the bit BL0 flow (this voltage is for example 2 V).

First of all, the voltage VWL of a selected word line VWL is set to VVF7. The threshold voltage Vth corresponding to write data "000" is determined. When the threshold voltage Vth of the memory cell transistor is higher than VVF7 (namely, Vth>VVF7), since no current flows to the cell, the voltage of the bit BL0 does not change. The voltage of the node SA is kept at $V_{cc}$. At this point, the transistors N15, N16, and N17 are turned on.

After a predetermined time period has elapsed, the signal levels of the control signals $\phi$LAT0, $\phi$LAT2, and $\phi$LAT6 as pulse signals are successively set to high.

When the signal level of the control signal φLAT0 is set to high, the transistor N18 is turned on. At this point, since the transistor N15 has been turned on, the signal level of the inverted storage node /Q2 of the latch circuit LQ2 is set to low. The storage node Q2 of the latch circuit LQ2 is changed from the low level to the high level. At this point, the signal levels of the gates of the transistors N22 and N32 connected to the storage node Q2 of the latch circuit LQ2 become high.

When the signal level of the control signal φLAT2 is set to high, the transistor N24 is turned on. At this point, since the transistors N23, N22, and N16 have been turned on, the signal level of the inverted storage node /Q1 of the latch circuit LQ1 is set to low. The storage node Q1 of the latch circuit LQ1 is changed from the low level to the high level. At this point, the signal level of the transistor N33 connected to the storage node Q1 of the latch circuit LQ1 becomes high.

When the signal level of the control signal φLAT6 is set to high, the transistor N34 is turned on. At this point, since the transistors N33 and N32 and the transistor N17 have been turned on, the signal level of the inverted storage node /Q0 of the latch circuit LQ0 is set to low. The signal level of the storage node Q0 of the latch circuit LQ0 is inverted from the low level to the high level.

Thus, when the threshold voltage Vth of the memory cell transistor whose write data is "000" is higher than VVF7 (Vth>VVF7), latched data of the latch circuits LQ2, LQ1, and LQ0 is inverted into "111". Thus, the memory cell transistor becomes the write prohibition state.

On the other hand, when the threshold voltage Vth of the memory cell transistor is lower than VVF7 (Vth<VVF7), a cell current that is higher than the leak compensation current flows. Thus, the voltage of the node SA lowers. The transistors HN1 and HN3 are turned on. Electric charges are re-divided between the capacitance CBL of the bit BL0 and the capacitance CSA (<<CBL) of the node SA. Thus, the voltage of the node SA becomes a low level that is nearly the same as the voltage ($V_{cc}$–Vth–Vth') of the bit BL0 (for example, around 1 V). Thus, even if the transistors N18, N24, and N34 are turned on with the control signals φLAT0, φLAT2, and φLAT6, since the signal levels of the gates of the transistors N15, N16, and N17 are low (for example, 1 V), the resistance between the drain and the source of each of the transistors N15, N16, and N17 is high. Thus, a current necessary for inverting the states of the storage nodes Q2 to Q0 of the latch circuits LQ2 to LQ0 cannot be supplied. As a result, the set state is maintained.

After the threshold voltage Vth in the state that the voltage VWL of the selected word line has been set to VVF7 has been determined, the signal level of the control signal Vref is set to low. Thus, the transistor P1 is turned on. Consequently, the power supply voltage $V_{cc}$ is supplied to the bit BL0. After the voltage of the bit BL0 becomes $V_{cc}$, the control signal Vref is set to a predetermined level (for example, 2 V).

Thereafter, the voltage VWL of the selected word line is set to VVF6. The threshold voltage Vth corresponding to write data "001" is determined. When the threshold voltage Vth of the memory cell transistor is higher than VVF6 (Vth>VVF6), since no current flows in the cell, the voltage of the bit BL0 does not change. The node SA is kept at $V_{cc}$. At this point, the transistors N15, N16, and N17 are turned on.

After a predetermined time period has elapsed, the signal levels of the control signals φLAT5 and φLAT1 as pulse signals are successively set to high.

When the signal level of the control signal φLAT5 is set to high, the transistor N31 is turned on. At this point, since the transistors N30 and N27 and the transistor N16 have been turned on, the signal level of the inverted storage node /Q1 of the latch circuit LQ1 is set to low. Thus, the signal state of the storage node Q1 of the latch circuit LQ1 is inverted from the low level to the high level. At this point, the signal level of the gate of the transistor N19 connected to the storage node Q1 of the latch circuit LQ1 becomes high. When the threshold voltage Vth of the memory cell transistor is lower than VVF7, since the signal level of the inverted storage node /Q1 of the latch circuit LQ1 has been inverted from the low level to the high level in the determination of the threshold voltage Vth in the state that the voltage VWL of the selected word line has been set to VVF7, no change takes place. When the threshold voltage Vth of the memory cell transistor whose write data is "000" has the relation of VVF7>Vth>VVF6, since the signal level of the storage node Q0 of the latch circuit LQ0 is low, the transistor N30 is turned off. Thus, the signal level of the storage node Q1 does not change.

When the signal level of the control signal φLAT1 is set to high, the transistor N21 is turned on. At this point, since the transistors N20 and N19 and the transistor N15 have been turned on, the signal level of the inverted storage node /Q2 of the latch circuit LQ2 is set to low. The signal level of the storage node Q2 of the latch circuit LQ2 is inverted from the low level to the high level. When the threshold voltage Vth of the memory cell transistor is higher than VVF7, since the signal level of the inverted storage node /Q2 of the latch circuit LQ2 has been inverted from the low level to the high level in the determination of the threshold voltage Vth in the state that the voltage VWL of the selected word line has been set to VVF7, no change takes place. When the threshold voltage Vth of the memory cell transistor whose write data is "000" has the relation of VVF7>Vth>VVF6, since the signal level of the storage node Q0 of the latch circuit LQ0 is low, the transistor N30 is turned on. The signal level of the storage node Q1 of the latch circuit LQ1 does not change. Thus, since the transistor N19 is not turned on, the signal level of the storage node Q2 of the latch circuit LQ2 does not change.

Thus, when the threshold voltage Vth of the memory cell transistor whose write data is "001" is higher than VVF6 (namely, Vth>VVF6), the latched data of the latch circuits LQ2, LQ1, and LQ0 is inverted into "111". Thus, a write prohibition state takes place.

On the other hand, when the threshold voltage Vth of the memory cell is lower than VVF6 (namely, Vth<VVF6), a cell current that is higher than the leak compensation current flows. Thus, the voltage of the node SA lowers. Consequently, the transistors HN1 and HN3 are turned on. Electric charges are re-divided between the capacitance CBL of the bit BL0 and the capacitance CSA (<<CBL) of the node SA. Thus, the voltage of the node SA becomes a low level that is nearly the same as the voltage ($V_{cc}$–Vth–Vth') of the bit BL0 (for example, around 1 V). Thus, even if the transistors N31 and N21 are turned on with the control signals φLAT5 and φLAT1, since the signal levels of the gates of the transistors N15 and N16 are low (for example, 1 V), the resistance between the drain and the source of each of the transistors N15 and N16 is high. Thus, a current necessary for inverting the states of the storage nodes Q1 and Q2 of the latch circuits LQ1 and LQ2 cannot be supplied. Consequently, the set state is maintained.

Likewise, when the voltage VWL of the selected word line is set to VVF5 and then the threshold voltage Vth of a memory cell transistor whose write data is "010" is determined, after a predetermined time period elapses, the signal levels of the control signals φLAT8 and φLAT1 as pulse signals are successively set to high. Only when the threshold voltage Vth of the memory cell transistor whose write data is "010" is higher than VVF5 (namely, Vth>VVF5), the latched data of the latch circuits LQ2, LQ1, and LQ0 is inverted into '111'.

When the voltage VWL of the selected word line is set to VVF4 and then the threshold voltage Vth of a memory cell transistor whose write data is "011" is determined, after a predetermined time period elapses, the signal level of the control signal φLAT1 as a pulse signal is set to high. Only when the threshold voltage Vth of a memory cell transistor whose write data is "011" is higher than VVF4 (namely, Vth>VVF4), the latched data of the latch circuits LQ2, LQ1, and LQ0 is inverted into "111".

After the voltage VWL of the selected word line is set to VVF3 and then the threshold voltage Vth of a memory cell transistor whose write data is "100" is determined, after a predetermined time period elapses, the signal levels of the control signals φLAT2 and φLAT6 as pulse signals are successively set to high. Only when the threshold voltage Vth of a memory cell transistor whose write data is "100" is higher than VVF3 (namely, Vth>VVF3), the latched data of the latch circuits LQ2, LQ1, and LQ0 is inverted into After the voltage VWL of the selected word line is set to VVF2 and then the threshold voltage Vth of a memory cell transistor whose write data is "101" is determined, after a predetermined time period elapses, the signal level of the control signal φLAT3 as a pulse signal is set to high. Only when the threshold voltage Vth of a memory cell transistor whose write data is "101" is higher than VVF2 (namely, Vth>VVF2), the latched data of the latch circuits LQ2, LQ1, and LQ2 is inverted into "111".

After the voltage VWL of the selected word line is set to VVF1 and then the threshold voltage Vth of a memory cell transistor whose write data is "110" is determined, after a predetermined time period elapses, the signal level of the control signal φLAT6 as a pulse signal is set to high. Only when the threshold voltage Vth of a memory cell transistor whose write data is "110" is higher than VVF1 (namely, Vth>VVF1), the latched data of the latch circuits LQ2, LQ1, and LQ0 is inverted into "111".

After the voltage VWL of the selected word line is set to VVF1 and then the threshold value Vth is determined, the inverted signals of all the latched data are wired-ORed. When at least one of the signals is "0", the signal level of the resultant signal becomes low. Thereafter, the rewriting operation is performed. When all the signals are "1", the writing operation is completed. The writing operation and the verifying operation are repeated until data has been sufficiently written to all the memory cell transistors or until a predetermined number of times the writing operation and the verifying operation are performed.

Figure 11:
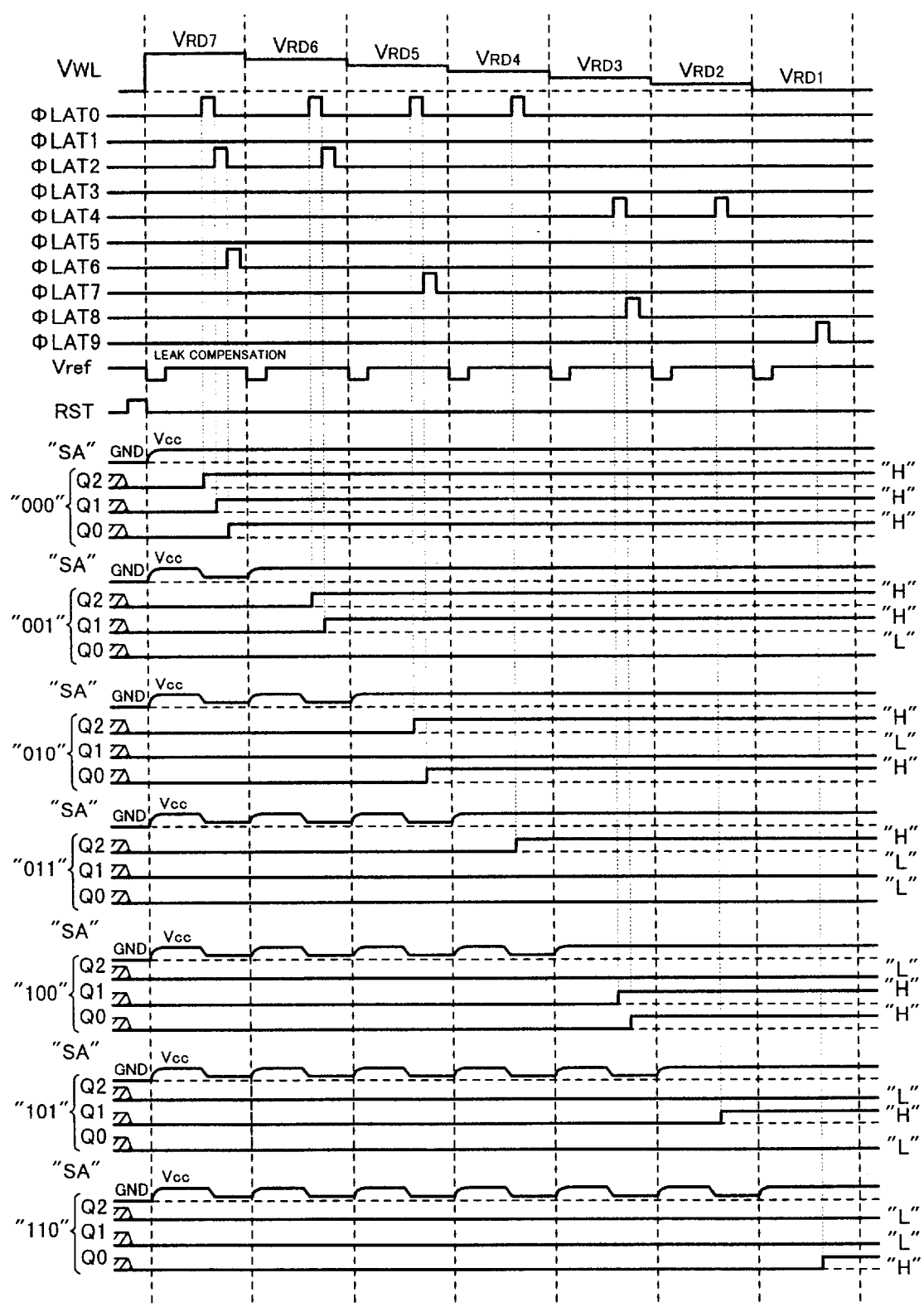
FIG. 11 is a timing chart for explaining a normal reading operation of the eight-value type NAND flash memory according to the embodiment of the present invention.

Next, the normal reading operation will be described. FIG. 11 shows signal states of individual portions in the normal reading operation of the NAND type flash memory according to the embodiment of the present invention. In this example, it is assumed that the memory string A0 has been selected as a read memory string. In addition, it is assumed that data is written to memory cell transistors corresponding to write data so that threshold voltages Vth and write data have the relation shown in FIG. 6.

Before the normal reading operation is performed, the signal level of the control signal PGM is set to GND. Thus, the transistor N2 is turned off. Consequently, the bit lines BL0 and BL1 are disconnected from the bit line voltage generating circuit 2. In addition, the signal levels of the address decode signals AiB and AiN and the control signal TRN are set to ($V_{cc}$-Vth). The signal level of the control signal Vref is set to $V_{cc}$. In addition, the signal level of control signal DIS is set to high. The transistor N1 is turned on. The signal levels of the bit lines BL0 and BL1 are set to GND.

Before the normal reading operation is performed, the signal level of the reset signal is set to high for a predetermined time period. The signal levels of data latched in the latch circuits LQ2 to LQ0 are reset to low. After the latch circuits LQ2 to LQ0 are reset (namely, after the signal levels of the control signal DSI and the reset signal RST are changed to low, the drain side selected gate line SG and the source side selected gate line SSG are set to a predetermined high voltage that is the same as the voltage of the non-selected word lines (for example P5 V ranging from 5.0 to 6.0 V). The voltage VWL of the selected word line is gradually lowered in the order of VRD7 to VRD6 to VRD5 to VRD4 to VRD3 to VRD2 to VRD1.

In addition, as a pre-process for determining the threshold voltage Vth of each voltage of word lines, the signal level of the control signal Vref is set to low and thereby the transistor P1 is turned on. Thus, the power supply voltage $V_{cc}$ is supplied to the bit BL0. After a predetermined time period has elapsed, the voltage of the bit BL0 rises. When the voltage between the gate and the source of the transistor HN1 becomes lower than Vth' (where Vth' is the threshold voltage of the transistor HN1), the transistors HN1 and HN3 are automatically turned off. Thus, the voltage ($V_{cc}$-Vth-Vth') (for example, around 1 V) is supplied to the bit BL0. The signal level of the node SA becomes $V_{cc}$.

In the above-described state, with a fixed value of the voltage of the selected word line, the threshold voltage Vth is determined corresponding to the voltage of the bit BL0 and the voltage of the node SA depending on whether or not a cell current flows. In other words, when a voltage that exceeds the threshold voltage Vth of a particular memory cell transistor is supplied to the gate thereof and a cell current flows, the voltage of the bit BL0 lowers. Thus, the transistors HN1 and HN3 are turned on. Consequently, the voltage of the node SA lowers to a low level that is nearly similar to the voltage ($V_{cc}$-Vth-Vth') of the bit BL0 (for example, around 1 V). When a voltage that is lower than the threshold voltage Vth of the particular memory cell transistor is supplied to the gate thereof, no cell current flows. The voltage of the bit BL0 does not lower. Instead, the voltage of the node SA is kept at $V_{cc}$. Corresponding to the relation, the threshold voltage Vth is determined.

After the voltage of the bit BL0 has raised, the control signal Vref is set to a predetermined level at which the transistor P1 allows a current necessary for compensating a leak current of the bit BL0 to flow (for example, 2 V).

First of all, the threshold voltage Vth is determined in the state that the voltage VWL of the selected word line has been set to VRD7. When the threshold voltage Vth of the memory cell transistor is higher than VRD7 (namely, Vth>VRD7), since no cell current flows, the node SA is kept at $V_{cc}$. At this point, the transistors N15, N16, and N17 are turned on.

After a predetermined time period has elapsed, the signal levels of the control signals φLAT0, φLAT2, and φLAT6 are successively set to high.

When the signal level of the control signal φLAT0 is set to high, the transistor N18 is turned on. At this point, since the transistor N15 has been turned on, the signal level of the inverted storage node /Q2 of the latch circuit LQ2 is set to low. The signal level of the storage node Q2 of the latch circuit LQ2 is inverted from the low level to the high level. At this point, the signal levels of the gates of the transistors N22 and N32 connected to the storage node Q2 of the latch circuit LQ2 becomes high.

When the signal level of the control signal φLAT2 is set to high, the transistor N24 is turned on. At this point, since the transistors N23 and N22 and the transistor N16 have been turned on, the signal level of the inverted storage node /Q1 of the latch circuit LQ1 is set to low. The signal level of the storage node Q1 of the latch circuit LQ1 is inverted from the low level to the high level. At this point, the signal level of the gate of the transistor N33 connected to the storage node Q1 of the latch circuit LQ1 becomes high.

When the signal level of the control signal φLAT6 is set to high, the transistor N34 is turned on. At this point, since the transistors N33 and N32 and the transistor N17 have been turned on, the signal level of the inverted storage node /Q0 of the latch circuit LQ0 is set to low. The signal level of the storage node Q0 of the latch circuit LQ0 is inverted from the low level to the high level.

Thus, when the threshold voltage Vth of the memory cell transistor is higher than VRD7 (namely, Vth>VRD7), the latched data of the latch circuits LQ2, LQ1, and LQ0 is inverted into "111".

On the other hand, when the threshold voltage Vth of the memory cell transistor is lower than VRD7 (namely, Vth<VRD7), a cell current larger than the leak compensation current flows. Thus, the voltage of the node SA lowers. Consequently, the transistors HN1 and HN3 are turned on. Electric charges are re-divided between the capacitance CBL of the bit BL0 and the capacitance CSA (<<CBL) of the node SA. Thus, the voltage of the node SA becomes a low level that is nearly the same as the voltage ($V_{cc}$–Vth–Vth') of the bit BL0 (for example, around 1 V). Thus, even if the transistors N18, N24, and N34 are turned on with the control signals φLAT0, φLAT2, and φLAT6, since the signal levels of the gates of the transistors N15, N16, and N17 are low (for example, 1 V), the resistance between the drain and the source of each of the transistors N15, N16, and N17 is high. Thus, a current necessary for inverting the storage nodes Q2 to Q0 of the latch circuits LQ2 to LQ0 cannot be supplied. Consequently, the low level state is kept as the reset state.

After the threshold voltage Vth has been determined in the state that the voltage VWL of the selected word line has been set to VRD7, the signal level of the control signal Vref is set to low. Thus, the transistor P1 is turned on. The power supply voltage $V_{cc}$ is supplied to the bit BL0. After the power supply voltage $V_{cc}$ has been supplied to the bit BL0, the control signal Vref is set to a predetermined level (for example, 2 V).

Next, the threshold voltage Vth is determined in the state that the voltage VWL of the selected word line has been set to VRD6. When the threshold voltage Vth of the memory cell transistor is higher than VRD6 (namely, Vth>VRD6), since no cell current flows, the node SA is kept at $V_{cc}$. At this point, the transistors N15, N16, and N17 are turned on.

After a predetermined time period has elapsed, the signal levels of the control signals φLAT0 and φLAT2 are successively set to high.

When the signal level of the control signal φLAT0 is set to high, the transistor N18 is turned on. At this point, since the transistor N15 has been turned on, the signal level of the inverted storage node /Q2 of the latch circuit LQ2 is set to low. The signal level of the storage node Q2 of the latch circuit LQ2 is inverted from the low level to the high level. At this point, the signal level of the gate of the transistor N22 connected to the storage node Q2 of the latch circuit LQ2 becomes high.

When the signal level of the control signal φLAT2 is set to high, the transistor N24 is turned on. At this point, since the transistors N23 and N22 and the transistor N36 have been turned on, the signal level of the inverted storage node /Q1 of the latch circuit LQ1 is set to low. The signal level of the storage node Q1 of the latch circuit LQ1 is inverted from the low level to the high level.

Thus, when the threshold voltage Vth of the memory cell transistor is higher than VRD6 (namely, Vth>VRD6), the latched data of the latch circuits LQ2, LQ1, and LQ0 is inverted to "110".

On the other hand, when the threshold voltage Vth of the memory cell transistor is lower than VRD6 (namely, Vth<VRD6), a cell current that is larger than the leak compensation current flows. The voltage of the node SA lowers. The transistors HN1 and HN3 are turned on. Electric charges are re-divided between the capacitance CBL of the bit BL0 and the capacitance CSA (<<CBL) of the node SA. Thus, the voltage of the node SA becomes a low level that is nearly the same as the voltage ($V_{cc}$–Vth–Vth') of the bit BL0 (for example, around 1 V). Thus, even if the transistors N18 and N24 are turned on with the control signals φLAT0 and φLAT2, since the signal levels of the gates of the transistors N15 and N16 are low (for example, 1 V), the resistance between the drain and the source of each of the transistors N15 and N16 is high. Consequently, a current necessary for inverting the storage nodes Q2 and Q1 of the latch circuits LQ2 and LQ1 cannot be supplied. Thus, the low level state as the reset stare is kept.

After the threshold voltage Vth has been determined in the state that the voltage VWL of the selected word line has been set to VRD6, the signal level of the control signal Vref is set to low. The transistor P1 is turned on. The power supply voltage $V_{cc}$ is supplied to the bit BL0. After the power supply voltage $V_{cc}$ has been supplied to the bit line BL0, the control signal Vref is set to a predetermined level (for example, 2 V).

Thereafter, the threshold voltage Vth is determined in the state that the voltage VWL of the selected word line has been set to VRD5. When the threshold voltage Vth of the memory cell transistor is higher than VRD5 (namely, Vth>VRD5), since no cell current flows, the node SA is kept at $V_{cc}$. At this point, the transistors N15, N16, and N17 are turned on.

With respect to latched data, the following cases can be considered.

(1) in the case of Vth>VRD7, latched data is "1111", (2) in the case of VRD7>Vth>VRD6, latched data is "110", and (3) in the case of VRD6>Vth>VRD5, latched data is "000".

Only in the case (3), the nodes of the latch circuits LQ2 and LQ0 are inverted. Thus, read data should be "101" in such a manner that it does not affect the cases (1) and (2).

In this case, after a predetermined time period has elapsed, the signal levels of the control signals φLAT0 and φLAT7 as pulse signals are successively set to high.

When the signal level of the control signal φLAT0 is set to high, the transistor N18 is turned on. At this point, since the transistor N15 has been turned on, the signal level of the inverted storage node /Q2 of the latch circuit LQ2 is set to low. The signal level of the storage node Q2 of the latch circuit LQ2 is inverted from the low level to the high level. At this point, the signal level of the gate of the transistor N3 connected to the storage node Q2 of the latch circuit LQ2 becomes high. On the other hand, in the cases (1) and (2), since the signal level of the storage node Q2 of the latch circuit LQ2 has been inverted into the high level, their latched data is not affected.

When the signal level of the control signal φLAT7 is set to high, the transistor N36 is turned on. At this point, in the case (3), since the transistor N35 and the transistors N32 and the transistor N17 have been turned on, the signal level of the inverted storage node /Q1 of the latch circuit LQ0 is set to low. The signal level of the storage node Q0 is inverted from the low level to the high level. At this point, in the cases (1) and (2), since the transistor N35 has been turned off, their latch data is not affected.

Thus, when the threshold voltage Vth of the memory cell transistor is higher than VRD5 (namely, Vth>VRD5), the latched data of the latch circuits LQ2, LQ1, and LQ0 is inverted into "101".

On the other hand, when the threshold voltage Vth of the memory cell transistor is lower than VRD5 (namely, Vth<VRD5), a cell current that is larger than the leak compensation current flows. The voltage of the node SA lowers. The transistors HN1 and HN3 are turned on. Electric charges are re-divided between the capacitance CBL of the bit BL0 and the capacitance CSA (<<CBL) of the node SA. Thus, the voltage of the node SA becomes a low level that is nearly the same as the voltage ($V_{cc}$–Vth–Vth') of the bit BL0 (for example, 1 V). Thus, even if the transistors N18 and N36 are turned on with the control signals φLAT0 and φLAT7, since the signal levels of the gates of the transistors N15 and N17 are low (for example, 1 V), the resistance between the drain and the source of each of the transistors N15 and N17 is high. Thus, a current necessary for inverting the storage nodes Q2 and Q0 of the latch circuits LQ2 and LQ0 cannot be supplied. Consequently, the low level state as the reset state is retained.

Likewise, when the threshold voltage Vth is determined in the case that the voltage VWL of the selected word line has been set to VRD4, after a predetermined time period elapses, the signal level of the control signal φLAT0 as a pulse signal is set to high. Only when the threshold voltage Vth of the memory cell transistor has the relation of VRD5>Vth>VRD4, the latched data of the latch circuits LQ2, LQ1, and LQ0 is inverted into "100".

When the threshold voltage Vth is determined in the case that the voltage VWL of the selected word line has been set to VRD3, after a predetermined time period elapses, the signal levels of the control signal φLAT4 and φLAT8 as pulse signals are successively set to high. Only when the threshold voltage Vth of the memory cell transistor has the relation of VRD4>Vth>VRD3, the latched data of the latch circuits LQ2, LQ1, and LQ0 is inverted into "011".

When the threshold voltage Vth is determined in the case that the voltage VWL of the selected word line has been set to VRD2, after a predetermined time period elapses, the signal level of the control signal φLAT4 as a pulse signal is set to high. Only when the threshold voltage Vth of the memory cell transistor has the relation of VRD3>Vth>VRD2, the latched data of the latch circuits LQ2, LQ1, and LQ0 is inverted into When the threshold voltage Vth is determined in the case that the voltage VWL of the selected word line has been set to VRD1, after a predetermined time period elapses, the signal level of the control signal φLAT9 as a pulse signal is set to high. Only when the threshold voltage Vth of the memory cell transistor has the relation of VRD2>Vth>VRD1, the latched data of the latch circuits LQ2, LQ1, and LQ0 is inverted into "001".

After the normal reading operation has been completed, an output signal corresponding to the threshold voltages Vth of a memory cell transistor is stored to the storage nodes Q2 to Q0 of the latch circuits LQ2 to LQ0. In other words, when the threshold voltage Vth corresponds to distribution 7, the relation of (Q2, Q1, Q0)=(1, 1, 1) is satisfied. When the threshold voltage Vth corresponds to distribution 6, the relation of (Q2, Q1, Q0)=(1, 1, 0) is satisfied. When the threshold voltage Vth corresponds to distribution 5, the relation of (Q2, Q1, Q0)=(1, 0, 1) is satisfied. When the threshold voltage Vth corresponds to distribution 4, the relation of (Q2, Q1, Q0)=(1, 0, 0) is satisfied. When the threshold voltage Vth corresponds to distribution 3, the relation of (Q2, Q1, Q0)=(0, 1, 1) is satisfied. When the threshold voltage Vth corresponds to distribution 2, the relation of (Q2, Q1, Q0)=(0, 1, 0) is satisfied. When the threshold voltage Vth corresponds to distribution 1, the relation of (Q2, Q1, Q0)=(0, 0, 1) is satisfied. When the threshold voltage Vth corresponds to distribution 0, the relation of (Q2, Q1, Q0)=(0, 0, 0) is satisfied. The inverted output signals are retrieved as read data.

According to the embodiment, when the writing operation is performed, the supplying time period for the effective voltage of word lines is controlled corresponding to write data. Thus, the following benefits are obtained.

In other words, according to the embodiment, in the multi-value parallel writing operation, when write data is "00x" where x is 0 or 1), the voltage of bit lines that is set corresponding to the write data is 0 V. When write data is "01x" where x is 0 or 1), the voltage of bit lines that is set corresponding to the write data is 1.2 V. When write data is "10x" where x is 0 or 1), the voltage of bit lines that is set corresponding to the write data is 1.5 V. When write data is "111", the voltage of bit lines that is set corresponding to the write data is 1.5 V. When write data is "111", the voltage of bit lines that is set corresponding to the write data is $V_{cc}$ (see FIG. 6B). In addition, when write data is "0xx" (where x is 0 or 1), the applying time period for the substantial voltage of word lines that is set corresponding to the write data is 20 μs. When write data is "10x" (where x is 0 or 1), the applying time period for the substantial voltage of word lines that is set corresponding to the write data is 10 μs. When write data is "110", the applying time period for the substantial voltage of word lines that is set corresponding to the write data is 2 μs. When write data is "111", the applying time period for the substantial voltage of word lines that is set corresponding to the write data is 0 μs (see FIG. 6C).

In this case, the pulse width of the effective voltage of word lines (write time period for substantial data) of memory cells whose write data is "110" and "10x," (where x is 0 or 1) is shorter than the supplying time period for the voltage of word lines. Thus, in the memory cell transistors whose write data is "110" and "10x" where x is 0 or 1), the threshold voltages are shifted with a delay. Thus, data is written with the voltage of bit lines that is higher than the real voltage.

In reality, when the voltage of bit lines that is set corresponding to write data and the pulse width of the substantial voltage of word lines are set as shown in columns (b) and (c) of FIG. 6, assuming that all the data write time period is 20 μs, the substantial voltage of bit lines (equivalent voltage of bit lines) is shown in column (d) of FIG. 6. The difference between the ideal voltage of bit lines and the equivalent voltage of bit lines is as shown in column (e) of FIG. 6.

As shown in column (e) of FIG. 6, according to the embodiment of the present invention, when write data is "101", the difference between the ideal voltage of bit lines and the equivalent voltage of bit lines becomes maximum. Thus, column (e) of FIG. 6 shows that the maximum value is 0.8 V. In this case, the voltage of word lines in the initial state of the writing operation is set to a voltage at which the most fast memory cell of those whose data is "101" becomes the write level in the first cycle of the writing operation. In other words, the voltage of word lines is set to a voltage lower than the ideal voltage by 0.8 V. On the other hand, in the case that the pulse width of the voltage of word lines is not controlled corresponding to write data (in other words, in the case that write time period of all data is the same (for example, 20 μs)), when write data is "110", the difference between the ideal voltage of bit lines and the real voltage of bit lines becomes maximum. In this case, the maximum value is 2.1 V. Thus, according to the embodiment of the present invention, since the difference between the ideal voltage of bit lines and the equivalent voltage of bit lines is as low as 0.8 V, the voltage of word lines can be set at a higher voltage in the initial state of the writing operation.

In the eight-value type NAND flash memory, the maximum number of times of the writing operation (Np) and the maximum writing time period (Tp) are defined as follows.

$$Np = 1 + (\Delta Vth0 + \delta Vpp + \delta Vch + \delta VBL)/\Delta Vpp \quad (1)$$

$$Tp = Np \times (Tpulse + 7 \times Tvfy) \quad (2)$$

where ΔVth0 is the difference between the threshold voltage of the memory cell with the highest write speed and the memory cell with the lowest write speed;

δVpp is the deviation of the write voltage VPGM in the writing state (the fluctuation of the voltage rising circuit);

δVch is the fluctuation of the voltage of bit lines against the setup voltage;

δVBL is the maximum value between the desired voltage of bit lines and the actually (or substantially) supplied voltage of bit lines;

ΔVpp is the step width of the voltage of word lines in the ISPP method;

Tpulse is the write time period of one operation (the pulse width of the word line voltage); and Tvfy is the verifying time period of one level.

In the formulas (1) and (2), when the maximum number of times of writing operation (Np) and the maximum writing time period (Tp) using to the ISPP method are obtained in conditions that do not accord to the embodiment of the present invention (for example, ΔVth0=2.0 V, δVpp=0.5 V, δVch=0.1 V, δVBL=3.6−1.5=2.1 V, ΔVpp=0.15 V, Tpulse= 20 μs, and Tvfy=2 μs)

Np=1+(2.0+0.5+0.1+(3.6−1.5)}/0.15=33 (times)

Tp=33×(20+7×2)=1122 (μs).

On the other hand, according to the embodiment of the present invention, with δVBL=0.8 V, the maximum number of times of writing operation (Np) and the maximum writing time period (Tp) are:

Np=1+(2.0+0.5+0.1+0.8)/0.15=24 (times)

Tp=24×(20+7×2)=816 (μs) Thus, according to the embodiment of the present invention, since the number of times of writing operation is remarkably reduced, the writing time period can be shortened.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention. For example, the values in the above-described embodiment (namely, the pulse width of the effective voltage of word lines that is set corresponding to write data and the voltage of bit lines) are just examples. Thus, the present invention is not limited to such values.

In addition, the structures of the memory cell array 1, the bit line voltage generating circuit 2, and the reading/verifying controlling circuit 3 are just examples. In other words, other circuit structures can be used.

In addition, according to the above-described embodiment, the present invention was applied for a NAND flash memory that stores data of three bits representing eight values. However, the present invention can be applied for a NAND flash memory that stores data of two bits representing four values.

As described above, in the nonvolatile semiconductor storage device and the data writing method thereof according to the present invention, voltages as pulses are supplied to word lines so as to write data to memory cells. At this point, since the effective pulse width of the voltage of word lines corresponding to the data writing time period for data written to write memory cells is controlled corresponding to write data, the voltage of word lines in the initial writing state can be set to high. Thus, when a multi-value parallel writing operation is performed by varying a bit line voltage corresponding to write data, the number of times of the writing operation can be reduced. Thus, the total writing time period can be shortened.

What is claimed is:

1. A nonvolatile semiconductor storage device comprising:
    a plurality of memory cells for storing data, said plurality of memory cells being connected to a bit line, a memory cell of said plurality of memory cells having a word line; and
    means for supplying a word line voltage to said word line, said word line voltage having an effective pulse width, the duration of said effective pulse width being based upon a threshold voltage value of said memory cell, said threshold voltage value relating to a bit line voltage supplied to said bit line;
    wherein said data are written simultaneously and page by page to said memory cell as multi-value write data of n bits, n being>2, said write data corresponding to said threshold voltage value.

2. The nonvolatile semiconductor storage device as set forth in claim 1, further comprising:
    a plurality of memory strings disposed in a form of matrix, each of said memory strings having said memory cell connected in series with another memory cell of said plurality of the memory cells, said each of said memory strings having a first end and a second end, said first end being connected to said bit line through a bit line select transistor and said second end being connected to a source line through a source line select transistor.

3. The nonvolatile semiconductor storage device as set forth in claim 2, further comprising write controlling means for supplying said bit line voltage to said bit line, said write controlling means having bit line voltage setting means for setting the value of said bit line voltage, said bit line voltage corresponding to said write data, and for controlling the timing of said bit line voltage setting means.

4. The nonvolatile semiconductor storage device as set forth in claim 3, wherein said write controlling means delays the voltage setting timing at which the voltage of the selected bit line is set corresponding to the write data in such a manner that the delay amount becomes bigger as the write level of the write data becomes shallower.

5. The nonvolatile semiconductor storage device as set forth in claim 3, wherein said write controlling means controls a voltage setting timing of the selected bit line, for a memory cell to which data that exceeds a predetermined write level is written, so as to start at the same timing when the voltage of word lines is supplied and, for a memory cell to which data that does not exceed the predetermined write level is written, so as to start at the timing when a predetermined time period elapses after the voltage of word lines is supplied.

6. The nonvolatile semiconductor storage device as set forth in claim 5, wherein said write controlling means controls a voltage setting timing of the selected bit line, for memory cells to which data that does not exceed a predetermined write level is written, so as to successively start writing the data to the memory cells in the order of deeper write levels of the write data when and then a predetermined time period elapses after the voltage of word lines is supplied.

7. A data writing method for a nonvolatile semiconductor storage device, said device including a plurality of memory cells for storing data, said plurality of memory cells being connected to a bit line, a memory cell of said plurality of memory cells having a word line, said method comprising:

supplying a word line voltage to said word line, said word line voltage having an effective pulse width, the duration of said effective pulse width being based upon a threshold voltage value of said memory cell, said threshold voltage value relating to a bit line voltage supplied to said bit line; and storing said data within said memory cell, wherein said data are written simultaneously and page by page to said memory cell as multi-value write data of n bits, n being>2, said write data corresponding to said threshold voltage value.

8. The data writing method as set forth in claim 7, wherein a plurality of memory strings are disposed in a form of matrix, each of said memory strings having said memory cell connected in series with another memory cell of said plurality of the memory cells, said each of said memory strings having a first end and a second end, said first end being connected to said bit line through a bit line select transistor and said second end being connected to a source line through a source line select transistor.

9. The data writing method as set forth in claim 8, further comprising the steps of:

setting the value of said bit line voltage, said bit line voltage corresponding to said write data; and controlling the timing of said bit line voltage setting means.

10. The data writing method as set forth in claim 9, further comprising the step of:

delaying the voltage setting timing at which the voltage of the selected bit line is set corresponding to the write data in such a manner that the delay amount becomes bigger as the write level of the write data becomes shallower.

11. The data writing method as set forth in claim 9, further comprising the step of:

controlling a voltage setting timing of the selected bit line, for a memory cell to which data that exceeds a predetermined write level is written, so as to start at the same timing when the voltage of word lines is supplied and, for a memory cell to which data that does not exceed the predetermined write level is written, so as to start at the timing when a predetermined time period elapses after the voltage of word lines is supplied.

12. The data writing method as set forth in claim 11, further comprising step of:

controlling a voltage setting timing of the selected bit line, for memory cells to which data that does not exceed a predetermined write level is written, so as to successively start writing the data to the memory cells in the order of deeper write levels of the write data when a predetermined time period elapses after the voltage of word lines is supplied.

* * * * *

UNITED STATES PATENT AND TRADEMARK OFFICE
CERTIFICATE OF CORRECTION

PATENT NO.    : 6,259,624 B1
DATED         : July 10, 2001
INVENTOR(S)   : Hiromi Nobukata It is certified that error appears in the above-identified patent and that said Letters Patent is hereby corrected as shown below:

<u>Column 30,</u>
Line 46, replace "n being > 2" with -- n being $\geq$ 2 --.

<u>Column 31,</u>
Lines 43-44, replace "n being > 2" with -- n being $\geq$ 2 --.

Signed and Sealed this

Sixth Day of August, 2002

Attest:

JAMES E. ROGAN
Attesting Officer    Director of the United States Patent and Trademark Office